(12) United States Patent
O'Meara et al.

(10) Patent No.: US 9,443,731 B1
(45) Date of Patent: Sep. 13, 2016

(54) MATERIAL PROCESSING TO ACHIEVE SUB-10NM PATTERNING

(71) Applicant: Tokyo Electron Limited, Minato-ku, Tokyo (JP)

(72) Inventors: David L. O'Meara, Albany, NY (US); Angelique D. Raley, Mechanicville, NY (US); Akiteru Ko, Schenectady, NY (US); Kiyohito Ito, Fishkill, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/627,501

(22) Filed: Feb. 20, 2015

(51) Int. Cl.
| | |
|---|---|
| *H01L 21/8234* | (2006.01) |
| *H01L 21/033* | (2006.01) |
| *H01L 21/311* | (2006.01) |

(52) U.S. Cl.
CPC ..... *H01L 21/0338* (2013.01); *H01L 21/31116* (2013.01); *H01L 21/31144* (2013.01); *H01L 21/823431* (2013.01)

(58) Field of Classification Search
CPC .......... H01L 21/02227; H01L 21/02365; H01L 21/64; H01L 21/70; H01L 21/702; H01L 21/8232
See application file for complete search history.

(56) References Cited

U.S. PATENT DOCUMENTS

| | | |
|---|---|---|
| 5,024,716 A | 6/1991 | Sato |
| 8,564,068 B2 | 10/2013 | Chang |
| 8,623,770 B1 | 1/2014 | Gao et al. |
| 2007/0113788 A1 | 5/2007 | Nozawa et al. |
| 2011/0057562 A1 | 3/2011 | Chen et al. |
| 2013/0302987 A1 | 11/2013 | Abatchev et al. |
| 2013/0306598 A1 | 11/2013 | Ko et al. |
| 2013/0323929 A1 | 12/2013 | Zhu |
| 2014/0038416 A1 | 2/2014 | Wells et al. |
| 2014/0045125 A1 | 2/2014 | Tran |
| 2014/0073137 A1 | 3/2014 | Cinnor et al. |

*Primary Examiner* — Cheung Lee
(74) *Attorney, Agent, or Firm* — Wood, Herron & Evans, LLP

(57) ABSTRACT

Provided is a method for increasing pattern density on a substrate comprising a structure with a patterned layer with a first composition and a sidewall and a cap layer of a second composition formed atop said structure. The sidewall is exposed to a chemical environment and creates a chemically modified sidewall layer of a third composition. The cap layer and an interior, non-modified portion of said structure is removed using an etching process to leave behind said chemically modified sidewall layer. A pattern transfer etch of said sidewall chemically modified layer onto the underlying layer of said substrate is performed. One or more integration operating variables are controlled to achieve target critical dimensions comprising width, height, sidewall angle, line width roughness, and/or line edge roughness of said structure.

20 Claims, 21 Drawing Sheets

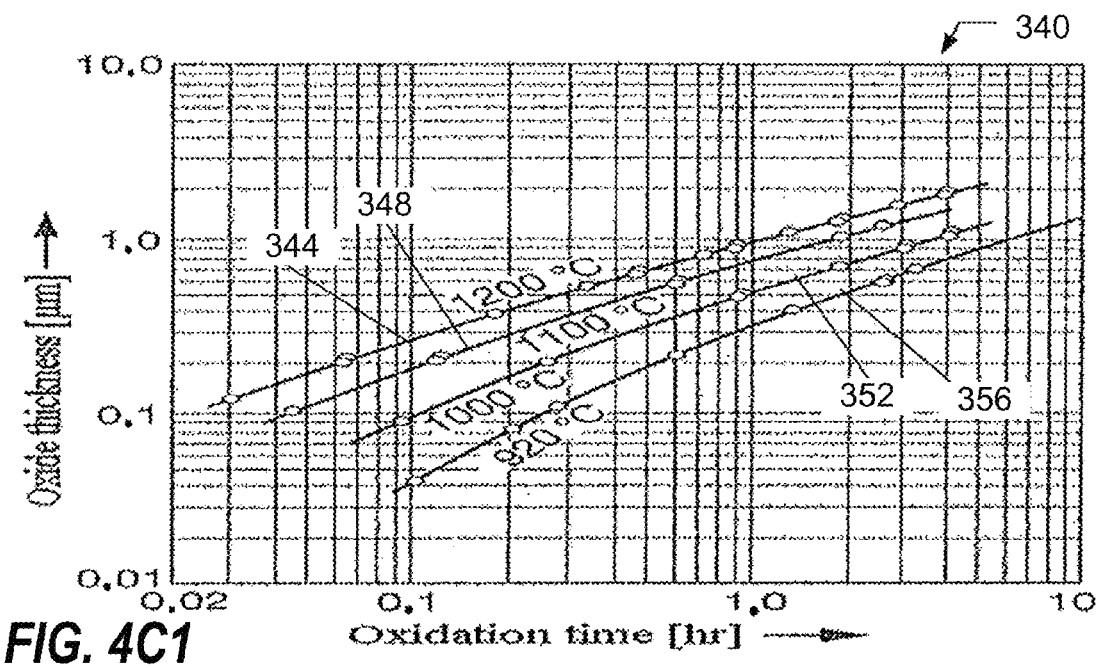
FIG. 4C1
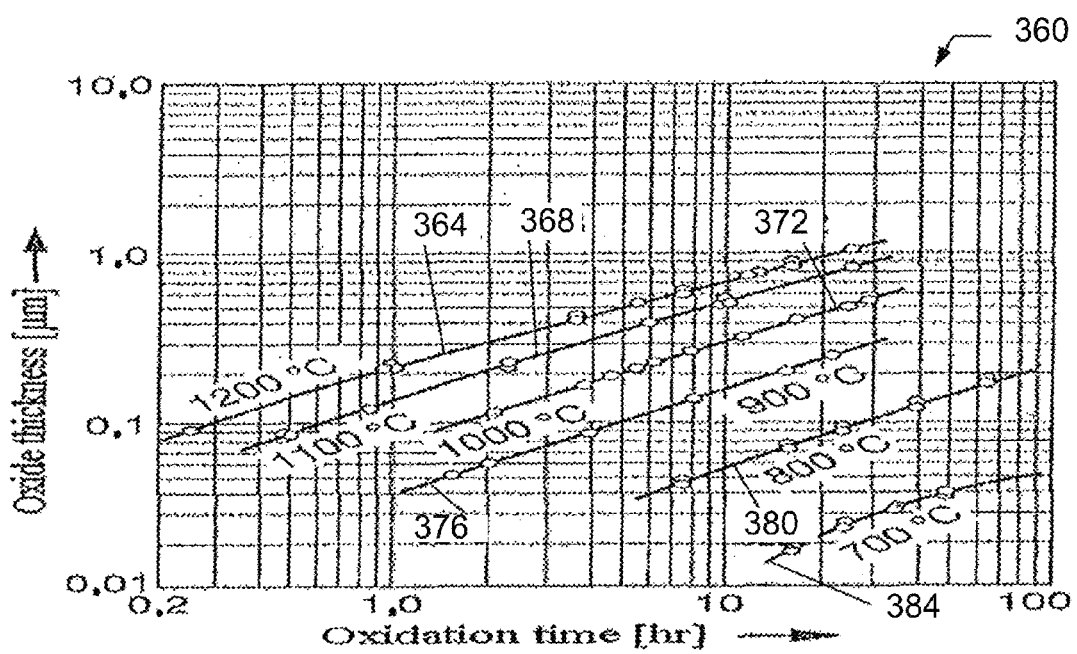
FIG. 4C2

US 9,443,731 B1

MATERIAL PROCESSING TO ACHIEVE SUB-10NM PATTERNING

BACKGROUND OF THE INVENTION

1. Field of Invention

The invention relates to a method of performing a sequence of semiconductor patterning operations on a substrate and specifically to perform patterning of a structure on the substrate under 10 nm.

2. Description of Related Art

In semiconductor manufacturing patterning of a film on a substrate can be achieved through several methods that have evolved with time to follow Moore's law. The first method is conventional lithography which can no longer be used alone to achieve advanced nodes critical dimensions (CD).

Double patterning is the technique used to create hard mask features smaller than photolithographic capabilities by using spacer deposition to define feature dimensions. Typical double patterning (DP) techniques require a sequence of deposition over a mandrel, etch to form the spacer and another etch to remove the mandrel, with both deposition and etch tools required. There are some spatial limitations inherent in the conventional DP technique due to deposition 'thin-ness' limitations and pitch of the features from mandrel formation limitations.

It is now combined with additional techniques such as self-aligned double patterning or DSA (directed self-assembly) to achieve the required CD. These methods can become costly and add several steps to the process. Advanced extreme ultra violet (EUV) lithography should be able to alleviate some of these issues once available but the constant drive to smaller CD will remain a challenge for the future technologies to come.

There is a need to fabricate structures with a CD in the range lower than those obtained using current photolithography techniques. More specifically, there is a need to: (1) get the CD of structures below 10 nm without using EUV lithography; (2) minimize the setup time of the integration steps to increase effective throughput, (3) minimize the number of tools needed to complete the process, and/or (4) reduce the cost of ownership.

SUMMARY OF THE INVENTION

Provided is a method for increasing pattern density of a structure on a substrate using an integration scheme, the method comprising: providing a substrate having a patterned layer of a first composition in a process chamber, said patterned layer comprising at least one structure with a sidewall and a top surface; exposing said structure to a chemical environment to chemically modify said sidewall and top surface of said structure to a predetermined depth by introducing a constituent of said chemical environment to an exposed surface region of said structure and creating a chemically modified sidewall and top cap layer of a second composition; selectively removing said top cap layer and an interior, non-modified portion of said structure to leave behind said chemically modified sidewall layer; selecting said chemical environment to include said constituent that modifies an etch resistance of said chemically modified sidewall layer to a class of etching agents used in selectively removing the interior, non-modified portion, said second composition being more resistant to said class of etching agents than said first composition; and performing a pattern transfer etch of said chemically modified sidewall layer onto the underlying layer of said substrate. A selected one or more integration operating variables are controlled in order to achieve one or more target critical dimensions of said structure. The one or more target critical dimensions can comprise width, height, sidewall angle, line width roughness, and/or line edge roughness of said structure.

In another embodiment, a method for increasing pattern density of a structure on a substrate using an integration scheme, said integration scheme having one or more integration operating variables, the method comprising: providing a substrate having a patterned layer in a process chamber, said patterned layer comprising at least one mandrel, said mandrel comprising organic planarizing spin-on material, silicon nitride, amorphous silicon, carbon or photoresist fabricated using a self-aligned double patterning scheme; depositing a conformal silicon spacer layer on said patterned layer; performing a spacer reactive ion etching (RIE) sequence using silicon etching chemistry; performing a mandrel-pull strip sequence using a stripping technique based on material used for said mandrel, said mandrel-pull strip sequence generating a silicon spacer with a sidewall and top surface; exposing said spacer to a chemical environment to chemically modify said spacer sidewall and top to a predetermined depth, creating a chemically modified sidewall layer and top cap layer; removing said modified top cap layer and bottom portion of the substrate proximate to said spacer; performing a spacer-pull etch sequence configured to remove non-modified portion of said spacer using at least one etching process to leave behind said chemically modified sidewall layer; and performing a pattern transfer etch sequence of said chemically modified sidewall layer onto an underlying layer of said substrate. A selected one or more integration operating variables are controlled in order to achieve one or more target critical dimensions of said structure. The one or more target critical dimensions can comprise width, height, sidewall angle, line width roughness, and/or line edge roughness of said structure.

BRIEF DESCRIPTION OF THE DRAWINGS

In the accompanying drawings:

FIG. 4C1 is an exemplary graph of oxide thickness as a function of oxidation time and substrate temperature during a process step in the integration scheme of the present invention;

FIG. 4C2 is another exemplary graph of oxide thickness as a function of oxidation time and substrate temperature during a process step in the integration scheme of the present invention;

FIGS. 13A and 13B depict a cross-sectional view and bottom view of a plasma source in accordance with another embodiment; and.

DETAILED DESCRIPTION OF SEVERAL EMBODIMENTS

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

FIG. 1A and FIGS. 2A to 2E will be discussed together in order to combine the operation steps and the diagrammatic representations of the structure undergoing patterning to achieve selected integration objectives, in this case, material processing to achieve sub-10 nm patterning.

Figure 1A:
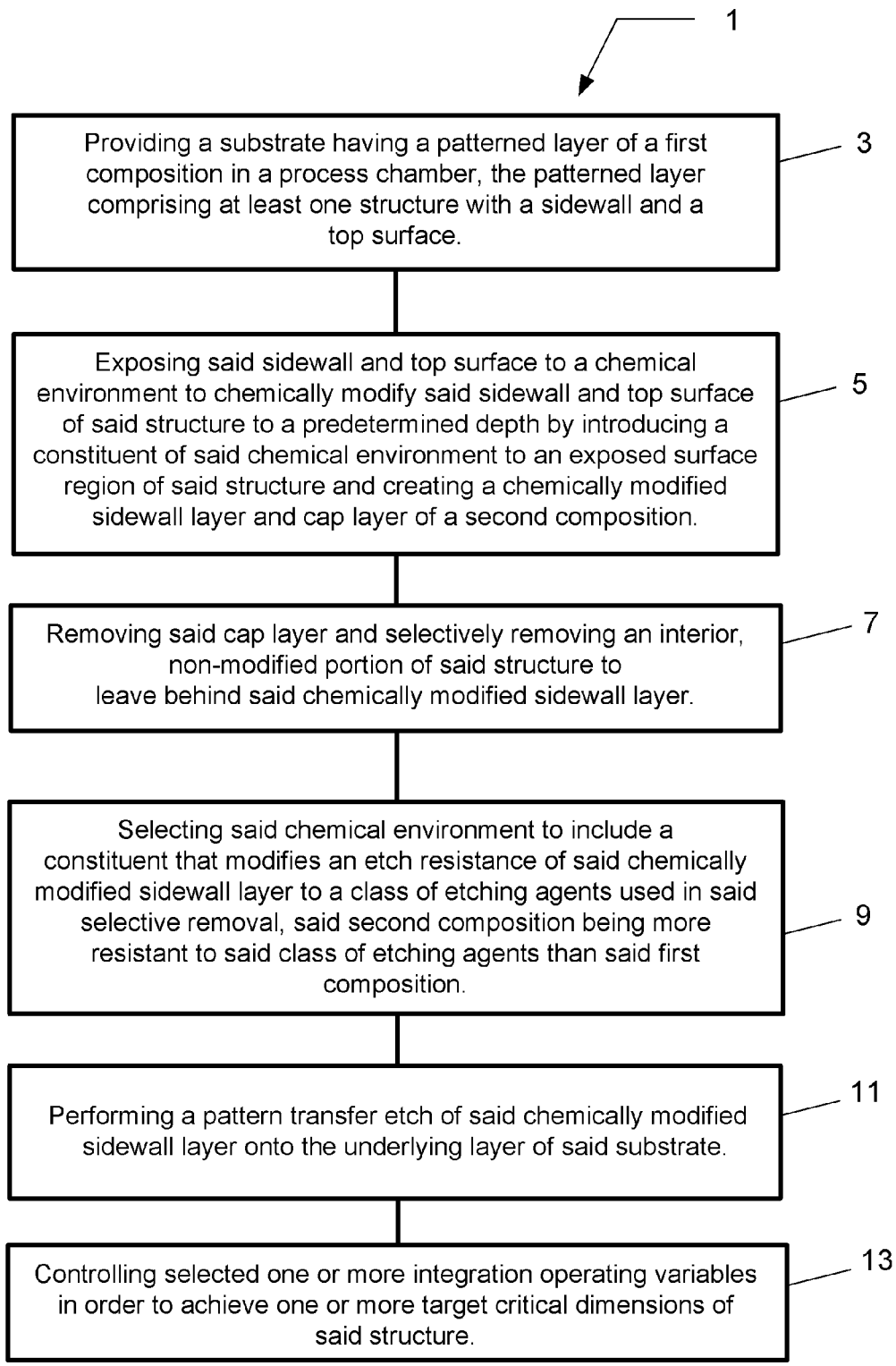
FIG. 1A depicts a flow chart illustrating an exemplary method for performing an integration scheme to form a structure with pattern density of less than 10 nm.

FIG. 1A depicts a flow chart 1 illustrating an exemplary method performing an integration scheme to form a structure with pattern density of less than 10 nm. FIGS. 2A to 2E are diagrammatic representations of the structure undergoing patterning operations. The method for increasing pattern density of a structure on a substrate uses an integration scheme, said integration scheme having one or more integration operating variables. The one or more integration operating variables can include pressure inside the process chamber, temperature of the substrate, partial pressure of one or more chemicals used to perform an etch or chemical treatment, the type of chemicals used, length of time for an integration operation, and the like. In operation 3 where references are directed to a schematic representation 40 of FIG. 2A, a substrate 51 having a patterned layer 45 of a first composition and an unpatterned layer 47 is provided in a process chamber (not shown), said patterned layer 45 comprising at least one structure 41 with a sidewall 49 and a top surface 43. The substrate 51 may be produced using the same process chamber used in previous patterning steps or loaded into the process chamber from external sources. The patterned layer 45 of the substrate 51 can be a silicon mandrel or silicon tetranitrate, $Si_3N_4$. The substrate 51 can include a SiON, SiN, or TiN stop layer 53. The substrate 51 may also have a substrate stop layer 53. The provided substrate 51 can be a substrate 51 fabricated using lithography, self-aligned double patterning (SADP), or directed self-assembly (DSA).

Figure 2A:
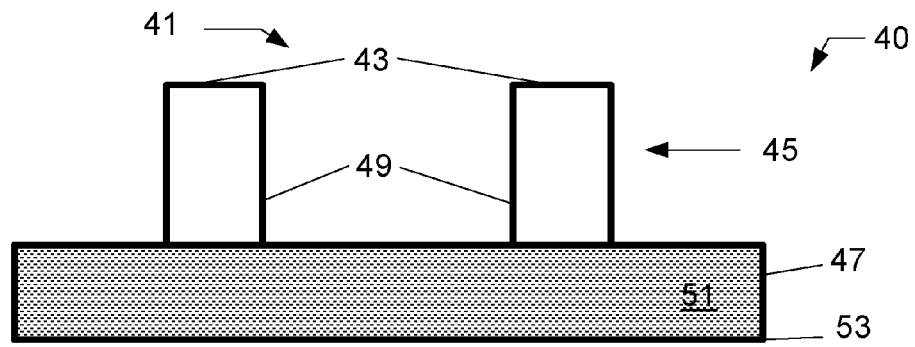
FIG. 2A depicts a schematic representation of an integration operation to provide a substrate with a patterned layer of a first composition comprising at least one structure in a process chamber.
Figure 2B:
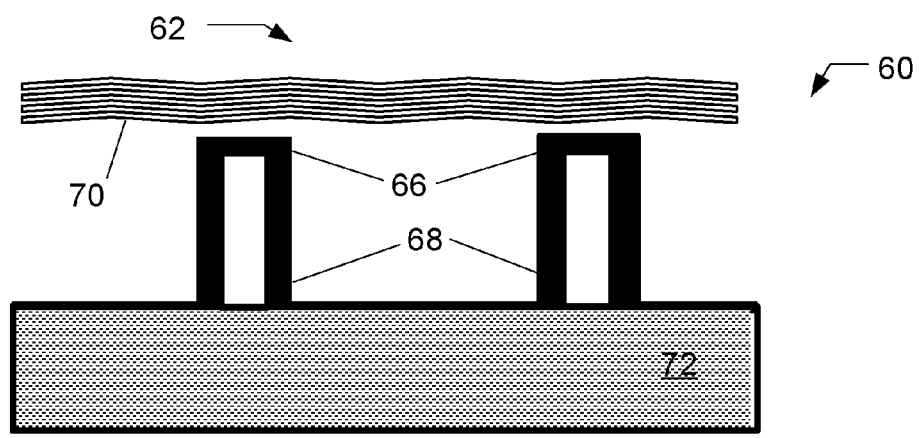
FIG. 2B depicts a schematic representation of an integration operation to chemically modify an exposed surface region of the patterned layer of the substrate.

In operation 5 where references are directed to a schematic representation 60 of FIG. 2B, said top surface 66 and sidewall 68 is exposed to a chemical environment 70 to chemically modify said top surface 66 and sidewall 68 of said structure 62 to a predetermined depth by introducing a constituent of said chemical environment 70 to an exposed surface region of said structure 62 and creating a chemically modified sidewall layer 68 and cap layer 66 of a second composition. The chemical environment 70 can be an oxygen-containing environment or a nitridation-containing environment, or other dopant-containing environment. If said chemical environment 70 comprises an oxygen-containing environment, said oxygen-containing environment comprises oxygen (O2), carbon monoxide, carbon dioxide, and/or nitrogen dioxide. Otherwise, if chemical environment 70 comprises a nitrogen-containing environment, said nitrogen-containing environment comprises nitrogen (N2), ammonia and/or hydrazine. Examples of dopant-containing environments include: borane, diborane, phosphine, and arsine.

Figure 2C:
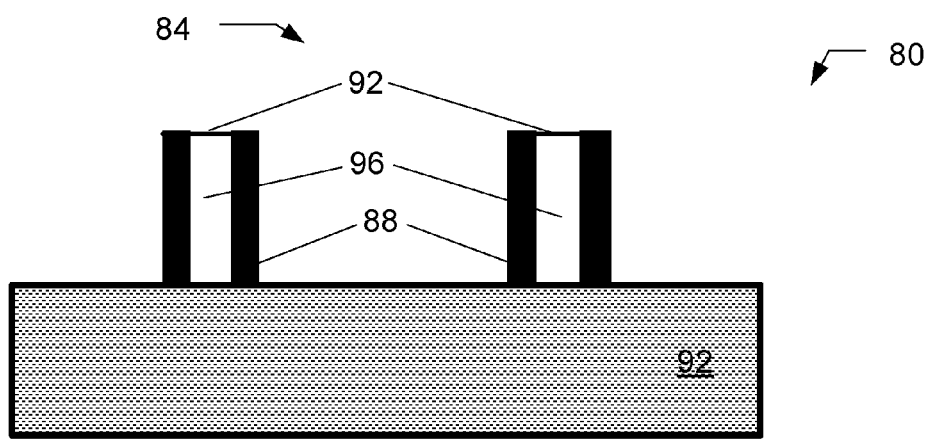
FIG. 2C depicts a schematic representation of an integration operation to perform a breakthrough etch.

In operation 7 where references are directed to a schematic representation 80 of FIG. 2C, said cap layer 92 of said structure 84 of substrate 92 is removed using at least one etching process to leave behind said chemically modified sidewall layer 88 and exposing an interior, non-modified portion 96 of said structure 84. The at least one etching process may include etching using carbon tetraflouride, oxygen, and argon or silicon hexafluoride, oxygen and helium. This operation is also known as a breakthrough of the cap layer 92 using the at least one etching process.

Figure 2D:
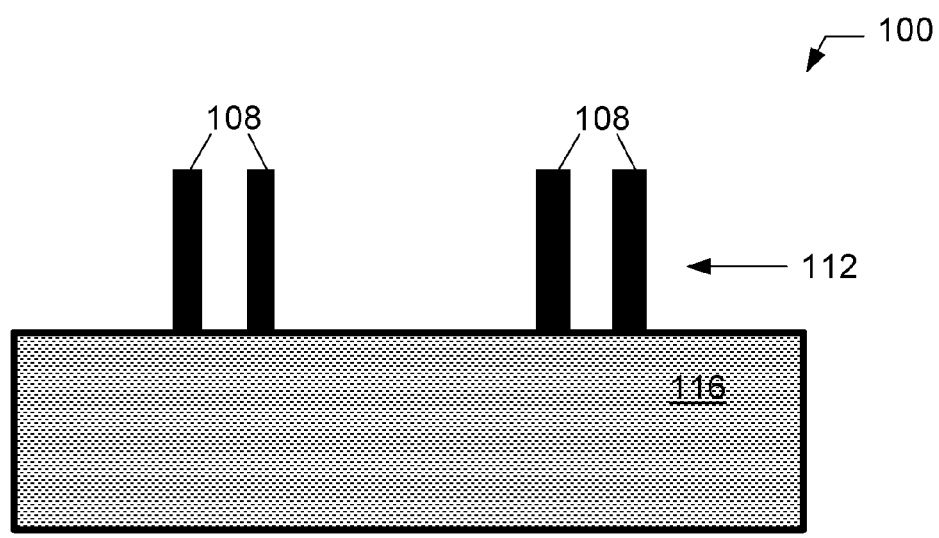
FIG. 2D depicts a schematic representation of an integration operation to selectively remove an interior, non-modified portion of the structure.

Further in operation 7, where references are directed to a schematic representation 100 of FIG. 2D, the interior, non-modified portion 96 of FIG. 2C is selectively removed using a selective etching process to leave behind said chemically modified sidewall layer 112 including structure 108. This operation is also referred to as a mandrel pull, where the mandrels (portion 96 in FIG. 2C) are etched out all the way to the base structure 108 ending on top of substrate 116. In operation 9, said chemical environment for operation 5 is selected to include a constituent that modifies an etch resistance of said chemically modified sidewall layer 112 to a class of etching agents used in said selective etching process of operation 7, said second composition being more resistant to said class of etching agents than said first composition.

Figure 2E:
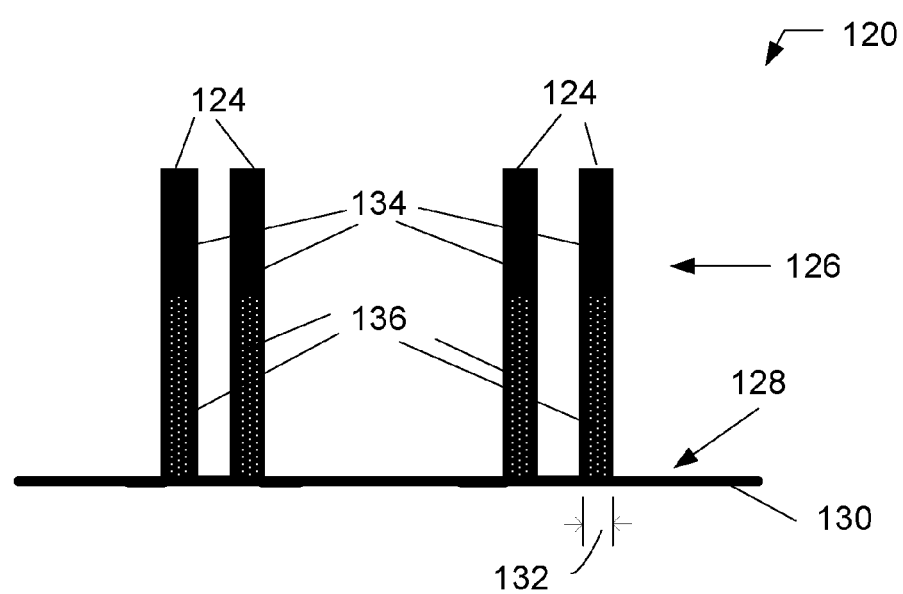
FIG. 2E depicts a schematic representation of an integration operation to perform a pattern transfer etch of the sidewall of the chemically modified layer of the substrate.

In operation 11 where references are directed to a schematic representation 120 of FIG. 2E, a pattern transfer etch of said chemically modified sidewall layer 126 onto the underlying layer of said substrate 128 is performed. Pattern etch transfer is accomplished by using etch chemicals that preferentially etch the substrate 128 down to the substrate stop layer 130 wherein the substrate stop layer 130 can comprise silicon nitride, silicon oxynitride, or titanium nitride. For example, to etch a SiN substrate, CH3F/O2/Ar or CH3F/O2/He would be used as these are highly selective to oxide. To etch a SiON substrate, a variation of the CH3F/O2/Ar condition with some additives like CO2 or other fluorocarbon gas can be used. To etch a TiN substrate, Cl2 based chemistry can be used. The pattern etch transfer etches the portion of the substrate 128 directly exposed to the etchants and leaves the portion of the substrate 128 protected by the structures 124. Portion of the substrate 128 left during the pattern transfer is indicated by the different, dot pattern 136 in the lower part of the structures 124 compared to the solid pattern 134 in the higher part of the structures 124. Pattern etch transfer are known to people in the art and will not be covered in detail here. The inventors were able to achieve structure thickness 132 that was in the range of, but not limited to, 1 to 9 nm.

In operation 13, selected one or more integration operating variables are controlled in order to achieve one or more target critical dimensions of said structure, said one or more target critical dimensions comprising width, height, sidewall angle, line width roughness, and/or line edge roughness of said structure. Control of the selected one or more integration operating variables in order to achieve one or more target critical dimensions of said structure may be done in one or more operations, i.e., operation 5, 7, 9, and/or 11 of the integration scheme.

In an embodiment, only one integration operating variable is selected, for example, oxide thickness on the structure during an oxidation process in operation 5, then the oxide thickness is controlled during the oxidation process and all other processes until the final pattern transfer etch in operation 11. In another embodiment, two integration operating variables, for example, the gas ratio of H2, O2, and N2, and length time of processing time are selected as the one or more integration operating variables for the integration scheme. In this case, the ratio and length time of processing are controlled in all the operations where such control is applicable. Any selection or combination of the integration operating variables can be used to control the relevant integration steps in order to achieve the one or more target critical dimensions comprising width, height, sidewall angle, line width roughness, line edge roughness, and the like.

The one or more integration operating variables for the integration process typically include process time, pressure in the process chamber, chemical and or gases used, flow rate of a chemical or gas, temperature of the substrate, plasma power, bias power, partial pressure of chemical or gas, ratio of a chemical or gas to other chemicals or gases and the like. The integration operating variables can be different with each operation step, for example, a deposition and an etch operation step will have different relevant integration operating variables.

One advantage of the foregoing integration scheme including exposing said sidewall, selectively removing said cap layer and said interior, non-modified portion of said structure, and performing said pattern transfer etch of said layer onto the underlying layer of said substrate is that all operations can be done in situ in said process chamber. In situ processing shortens the overall processing time, enabling higher throughput in number substrates per hour and lower cost of ownership.

In one embodiment, the process chamber uses a high density plasma generated using a power source including inductive coupled plasma (ICP), radial line slot antenna (RLSA), or electron cyclotron resonance (ECR) devices. In another embodiment, removing said cap layer utilizes a plasma chemistry and is performed using carbon tetraflouride, oxygen, and argon or silicon hexafluoride, oxygen, and helium. In one, application, the substrate includes a substrate stop layer, said stop layer comprising silicon oxynitride, silicon nitride, or titanium nitride. The inventors were able to achieve a width of a range of 1 to 2 nm, 1 nm to 7 nm, or 3 to 5 nm of the structures after the pattern etch transfer in operation 11, results that are beyond the capability of current lithographic patterning techniques. The ranges of the one or more integration operating variables include the hydrogen, oxygen, and nitrogen ratio in a range from 0/50/9,000 to 300/400/11,000; the plasma chamber walls are set to about 80° C., the wafer temperature can be set in range from 0 to 200° C., the oxide layer thickness in a range from 0.01 to 1.05 nm; the water vapor partial pressure in a range from 0.10 to 1.00 Torr; the oxidation time in a range from 0.02 to 50 hours; and the thickness of the chemically modified sidewall layer being one of 9.0 nm or less, 7.0 nm or less; or 5 nm or less.

Figure 1B:
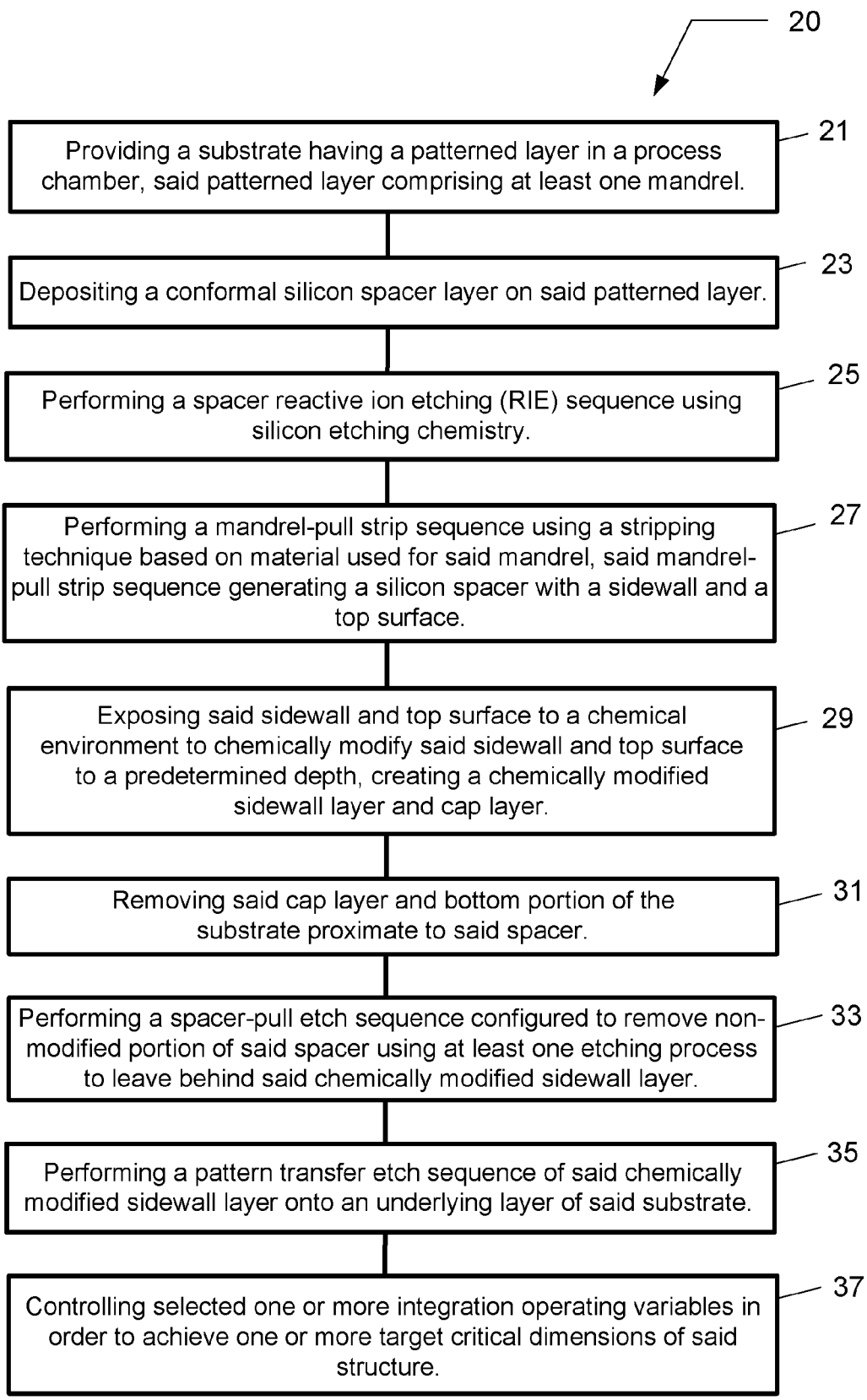
FIG. 1B depicts another flow chart illustrating another exemplary method for performing an integration scheme to form a structure with pattern density of less than 10 nm.
Figure 3A:
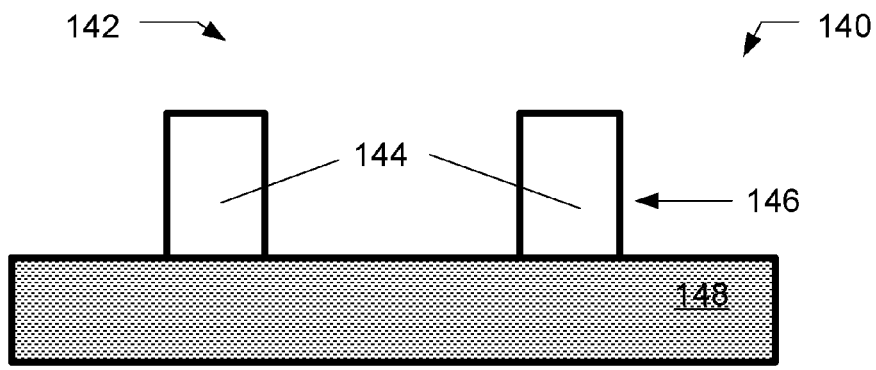
FIG. 3A depicts a schematic representation of an integration operation to provide a substrate with a patterned layer of a first composition comprising at least one structure in a process chamber.

FIG. 1B depicts another flow chart 20 illustrating another exemplary method for performing an integration scheme to form a structure with pattern density of less than 10 nm. In operation 21 where references are directed to a schematic representation 140 of FIG. 3A, a substrate 148 having a patterned layer 146 is provided in a process chamber (not shown), said patterned layer 146 comprising a structure 142 of at least one mandrel 144, said mandrel 144 comprising organic planarizing spin-on material, silicon nitride, or photoresist fabricated using a self-aligned double patterning scheme. The substrate 148 may have been produced using the same process chamber or loaded into the process chamber from external sources. The patterned layer 146 of the substrate 148 can be a silicon mandrel or silicon tetranitrate, Si3N4. Alternatively, the patterned layer 146 can be an organic dielectric layer (ODL), silicon nitrate, resist, or an amorphous carbon layer (APF). The substrate 148 can include a SiON, SiN, or TiN stop layer. The provided substrate 148 can be a substrate fabricated using extreme ultra violet (EUV) lithography or self-aligned double patterning (SADP).

Figure 3B:
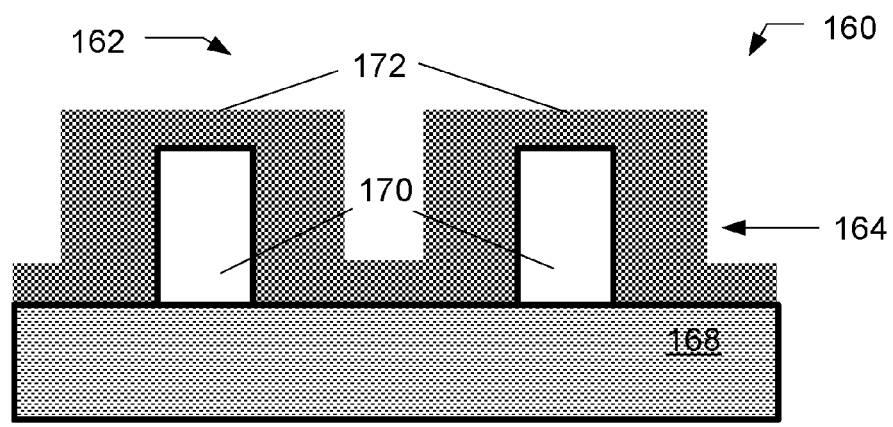
FIG. 3B depicts a schematic representation of an integration operation to deposit a conformal layer on the patterned layer.

In operation 23 where references are directed to a schematic representation 160 of FIG. 3B, a conformal spacer layer 172 on said patterned layer 164 above substrate 168 is deposited. Conformal spacer layer deposition is known in the art and shall not be discussed here. The conformal spacer layer 172 may be deposited on mandrels 170 of structure 162 using a chemical vapor deposition (CVD) process, a plasma-enhanced CVD (PECVD) process, an atomic layer deposition (ALD) process, a plasma-enhanced ALD (PEALD) process, a physical vapor deposition (PVD) process, a sputtering process, etc., and the processes involved are described in relation to FIG. 1A above. In operation 25 where references are directed to schematic representation 180 of FIG. 3C, a spacer reactive ion etching (RIE) sequence using silicon etching chemistry is performed on the patterned layer 184 above the substrate 186. Hydrogen bromide HBr, chlorine Cl2, sulfur hexafluoride SF6, or tetra-flouromethane CF4 can be used as the etching agent. The conformal layer 188 is etched anisotropically removing the conformal layer from the top all the way down to the top of the mandrels 190 of structure 182. In addition, the conformal layer on the surface of the substrate 186 proximate to the substrate 186 surface is removed. The steps and specification of a spacer RIE sequence are similar to the process described in relation to FIG. 1A above and shall not be replicated here.

Figure 3C:
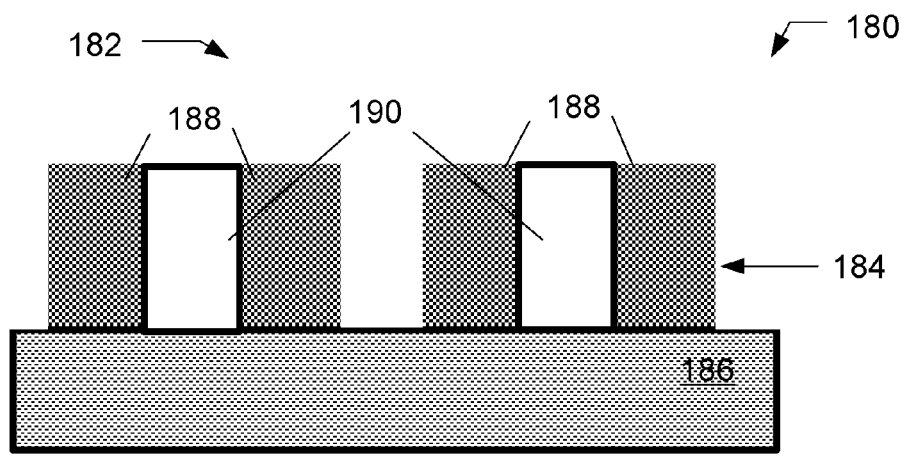
FIG. 3C depicts a schematic representation of an integration operation to perform a space reactive ion etching (RIE) sequence on the patterned layer.
Figure 3D:
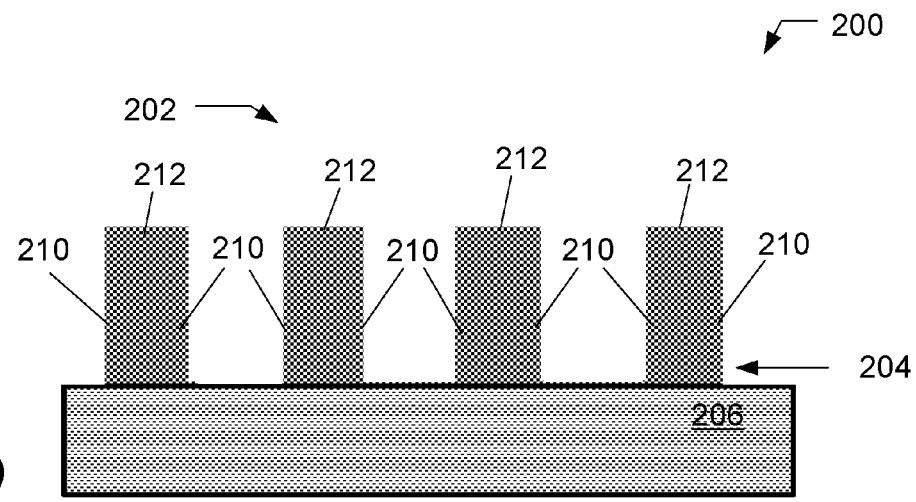
FIG. 3D depicts a schematic representation of an integration operation to perform a mandrel-pull strip sequence generating a silicon spacer.

In operation 27 where references are directed to a schematic representation 200 of FIG. 3D, a mandrel-pull strip sequence to etch the mandrels 190 from FIG. 3C down to the substrate 206 using a stripping technique based on material used for said mandrels, said mandrel-pull strip sequence generating spacers 202 with a sidewall 210 and a top surface 212. In one embodiment, the mandrel structure is an organic dielectric layer or amorphous carbon layer, an in situ plasma strip sequence is used to pull or strip the mandrel structure. In another embodiment, the mandrel structure is silicon nitrate, and a wet bench pull or strip of the mandrel structure is done with hot phosphoric acid.

Figure 3E:
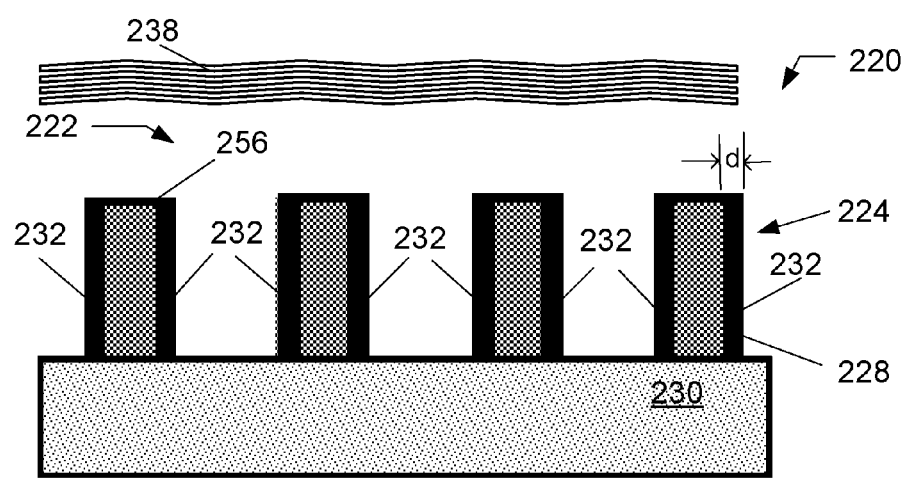
FIG. 3E depicts a schematic representation of an integration operation to expose the spacer to a chemical environment to chemically modify the sidewall and top surface.

In operation 29 where references are directed to a schematic representation 220 of FIG. 3E, said sidewall 232 and top surface is exposed to a chemical environment to chemically modify said sidewall 232 and top surface to a predetermined depth, creating a chemically modified sidewall layer 224 of the substrate 230 and cap layer 256. The chemical environment 238 can be an oxygen-containing or nitrogen-containing environment. The sidewall 232 is exposed to the chemical environment to chemically modify said sidewall 232 of said structure 222 to a predetermined depth, d, by introducing a constituent of said chemical environment to an exposed surface region of said structure 222 and creating a chemically modified sidewall layer 228 and cap layer 256. The chemical environment 238 can be an oxygen-containing environment or a nitridation-containing environment, or other dopant containing environment. If said chemical environment 238 comprises an oxygen-containing environment, said oxygen-containing environment comprises oxygen (O2), carbon monoxide, carbon dioxide, and/or nitrogen dioxide. Otherwise, if chemical environment 238 comprises a nitrogen-containing environment, said nitrogen-containing environment comprises nitrogen (N2), ammonia and/or hydrazine. Examples of dopant containing environments include: borane, diborane, phosphine, and arsine.

Figure 3F:
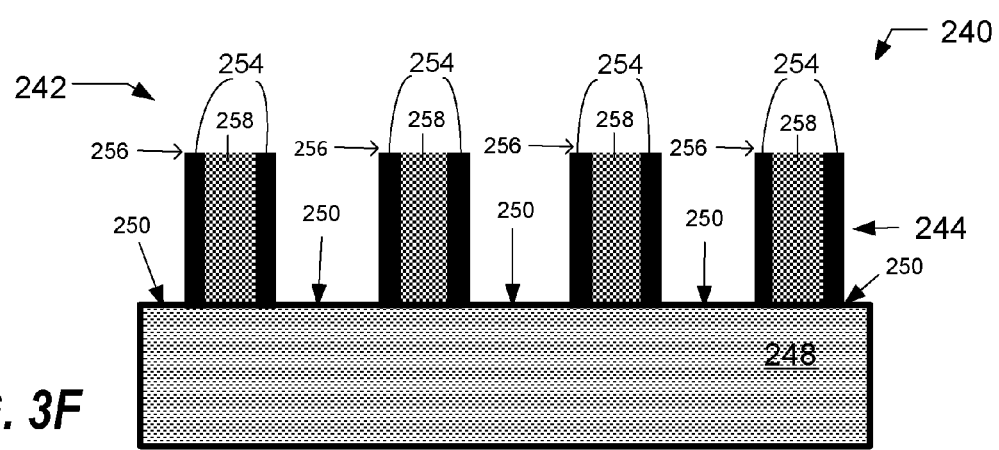
FIG. 3F depicts a schematic representation of an integration operation to remove the cap layer and bottom portion of the substrate proximate to the spacer.

In operation 31 where references are directed to a schematic representation 240 of FIG. 3F, said cap layer 256 and bottom portion 250 of the substrate 248 proximate to said spacer sidewalls 254 are removed using at least one etching process to leave behind said chemically modified sidewall layer 244 and exposing an interior, non-modified portion 258 of said spacers 242. This operation is also known as a breakthrough of the cap layer 256.

Figure 3G:
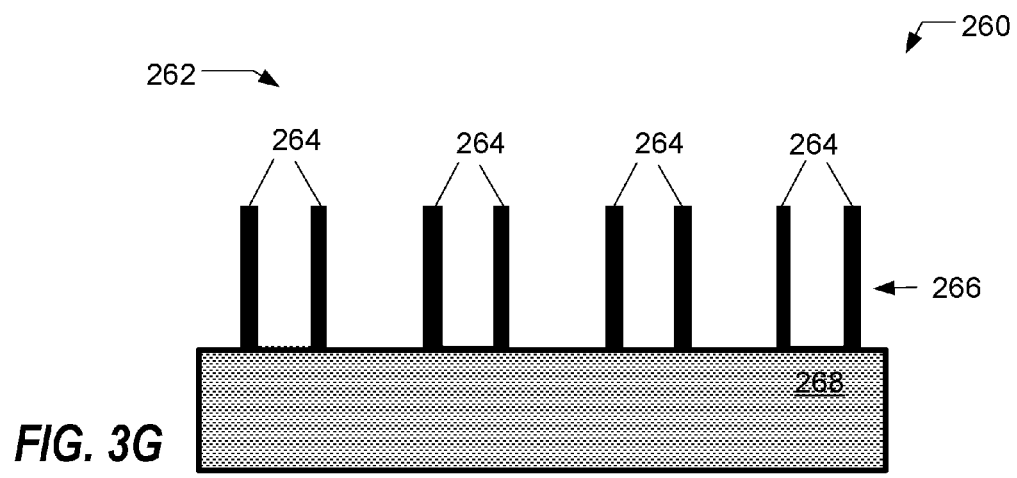
FIG. 3G depicts a schematic representation of an integration operation to performing a spacer-pull etch sequence to remove a non-modified portion of the spacer.

In operation 33 where references are directed to a schematic representation 260 of FIG. 3G, a spacer-pull etch sequence configured to remove the non-modified portion 258 of FIG. 3F of said spacers 262 using at least one etching process to leave behind said sidewalls 264 of the chemically modified sidewall layer 266 is performed. This particular operation is also known as a spacer pull, a process well known to people in the art, thus it will not be discussed in detail here.

Figure 3H:
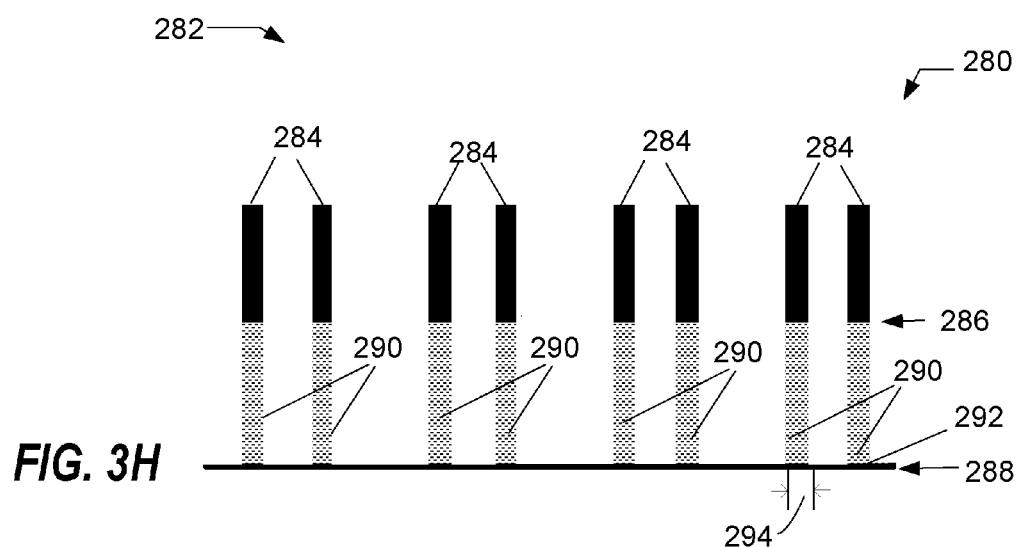
FIG. 3H depicts a schematic representation of an integration operation to perform a pattern transfer etch sequence of the chemically modified sidewall layer onto an underlying layer of the substrate.

In operation 35 where references are directed to schematic representation 280 of FIG. 3H, a pattern transfer etch sequence of said chemically modified sidewall layer 286 onto an underlying layer 290 of said substrate 292 is performed, leaving the substrate stop layer 288. The pattern etch transfer etches the portion of the substrate 292 directly exposed to the etchants and leaves the portion of the substrate 292 protected by the structures 282. Portion of the substrate 292 left during the pattern transfer is indicated by the different, dot pattern 290 in the lower part of the structures 282 compared to the solid pattern 284 in the higher part of the structures 282. Pattern etch transfer are known to people in the art and will not be covered in detail here. The inventors were able to achieve structure thickness 294 that was in the range of, but not limited to, 1 to 9 nm.

In operation 37, selected one or more integration operating variables are controlled in order to achieve one or more target critical dimensions of said structure, said one or more target critical dimensions comprising width, height, sidewall angle, line width roughness or line edge roughness of said structure. Other target critical dimensions such as three-dimensional critical dimensions may also be used depending on the semiconductor applications. As mentioned above, control of the selected one or more integration operating variables in order to achieve one or more target critical dimensions of said structure may be done in one or more operations, i.e., operation 23, 25, 27, 29, 31, 33, and/or 35 of the integration scheme.

As also mentioned above, only one integration operating variable is selected, for example, oxide thickness on the structure during the oxidation process, then the oxide thickness is controlled during the oxidation operation and all other operations including the final pattern transfer etch. In another embodiment, two integration operating variables, for example, the gas ratio of H2, O2, and N2, and length time of processing time are selected as the one or more integration operating variables for the integration process. In this case, the ratio and length time of processing time are controlled in all the operations where such control is applicable. Any selection or combination of the integration operating variables can be used to control the relevant integration operations in order to achieve the one or more one or more target critical dimensions comprising width, height, sidewall angle, line width roughness, line edge roughness, and the like.

The one or more integration operating variables for the integration process typically include one or more of process time, pressure in the process chamber, chemical and or gases used, flow rate of a chemical or gas, temperature of the substrate, plasma power, bias power, partial pressure of chemical or gas, ratio of a chemical or gas to other chemicals or gases and the like. The integration operating variables can be different with each operation, for example, a deposition and an etch operation step will have different relevant integration operating variables. The ranges of the one or more integration operating variables included the hydrogen, oxygen, and nitrogen ratio in a range from 0/50/9,000 to 300/400/11,000; the temperature of the process chamber in a range from 700 to 1200° C.; the oxide cap layer thickness in a range from 0.01 to 1.05 nm; the water vapor partial pressure in a range from 0.10 to 1.00 Torr; the oxidation time in a range from 0.02 to 50 hours; and the thickness of the chemically modified sidewall layer being one of 9.0 nm or less, 7.0 nm or less; or 5 nm or less.

Figure 4A:
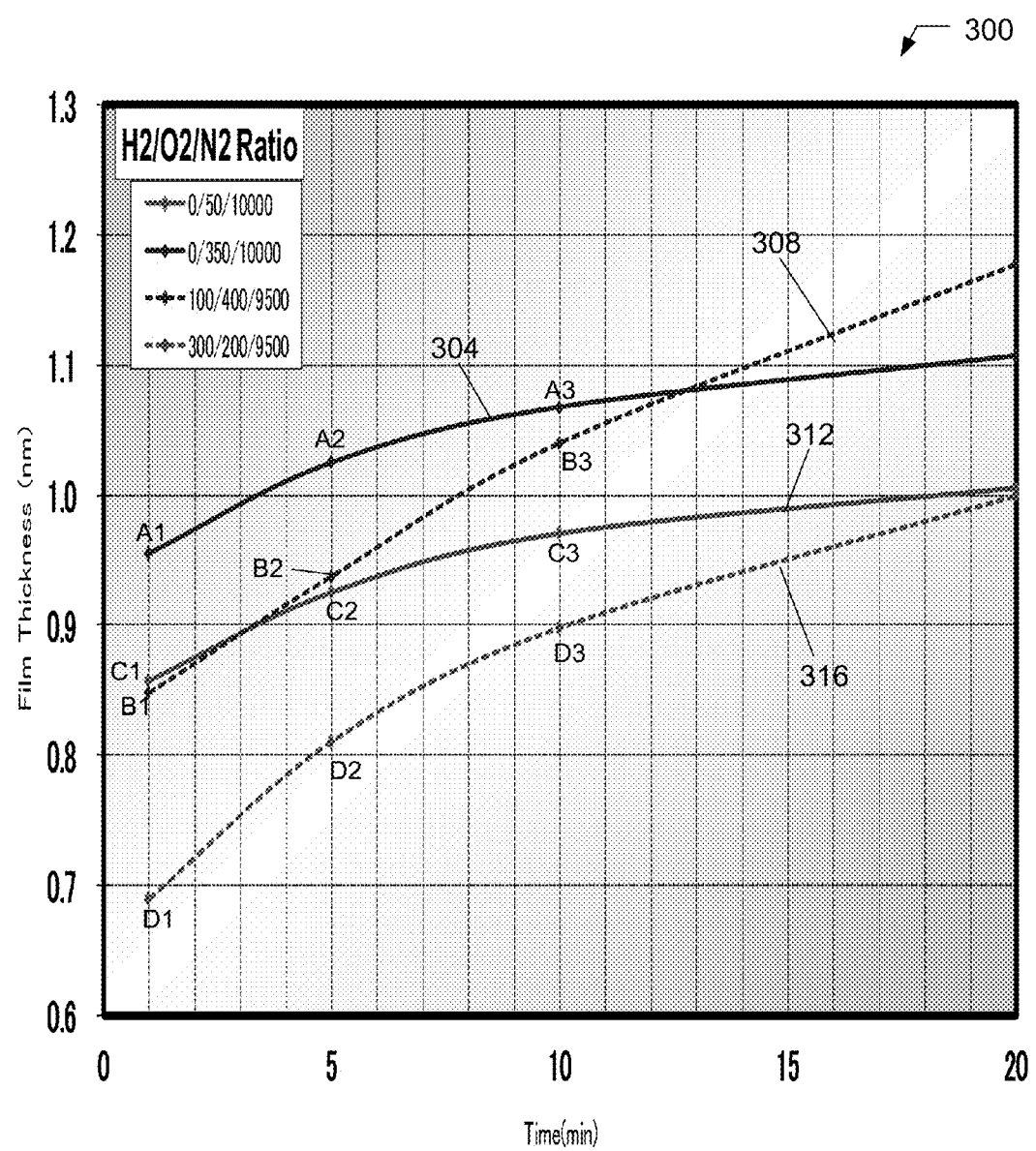
FIG. 4A is exemplary graph of the thickness of a structure in a patterned layer on the substrate as a function of elapsed of time of processing and the hydrogen, oxygen, and nitrogen ratio of the chemical environment in the process chamber during a step in the integration scheme of the present invention.

FIG. 4A is exemplary graph 300 of the thickness or width of a structure in a patterned layer on the substrate as a function of elapsed process time of a thermal oxidation and as a function of the hydrogen, oxygen, and nitrogen ratio of the chemical environment in the process chamber during a step in the integration scheme of the present invention. Curve 304 with an H2/O2/N2 ratio of 0/350/10,000 has a film thickness of 0.95 nm after 1 min, point A1; a film thickness of 1.03 nm after 5 min, point A2; and a film thickness of 1.06 nm after 10 min, point A3. Curve 308 with an H2/O2/N2 ratio of 100/400/9,500 has a film thickness of 0.86 nm after 1 min, point B1; a film thickness of 0.94 nm after 5 min, point B2; and a film thickness of 1.08 nm after 10 min, point B3. Curve 312 with an H2/O2/N2 ratio of 0/50/10,000 has a film thickness of 0.85 nm after 1 min, point C1; a film thickness of 0.93 nm after 5 min, point C2; and a film thickness of 0.96 nm after 10 min, point C3. Curve 316 has an H2/O2/N2 ratio of 300/200/9,500 has a film thickness of 0.69 nm after 1 min, point D1; a film thickness of 0.81 nm after 5 min, point D2; and a film thickness of 0.90 nm after 10 min, point D3. The four curves show that higher ratios of oxygen to the hydrogen and nitrogen increased the film thickness and that a longer time of exposure increased the film thickness while the length of time is less than 20 minutes. The oxidation trends in the FIG. 4A graph also shows the thickness sensitivity to process time. Curves 304 and 312, with no hydrogen, show a slow change in oxidation thickness between 10 min and 20 min of oxidation process time, demonstrating tight control of the oxidation thickness target. Curves 308 and 316 show a higher trend slope, demonstrating a condition with relatively less oxidation thickness control.

Figure 4B:
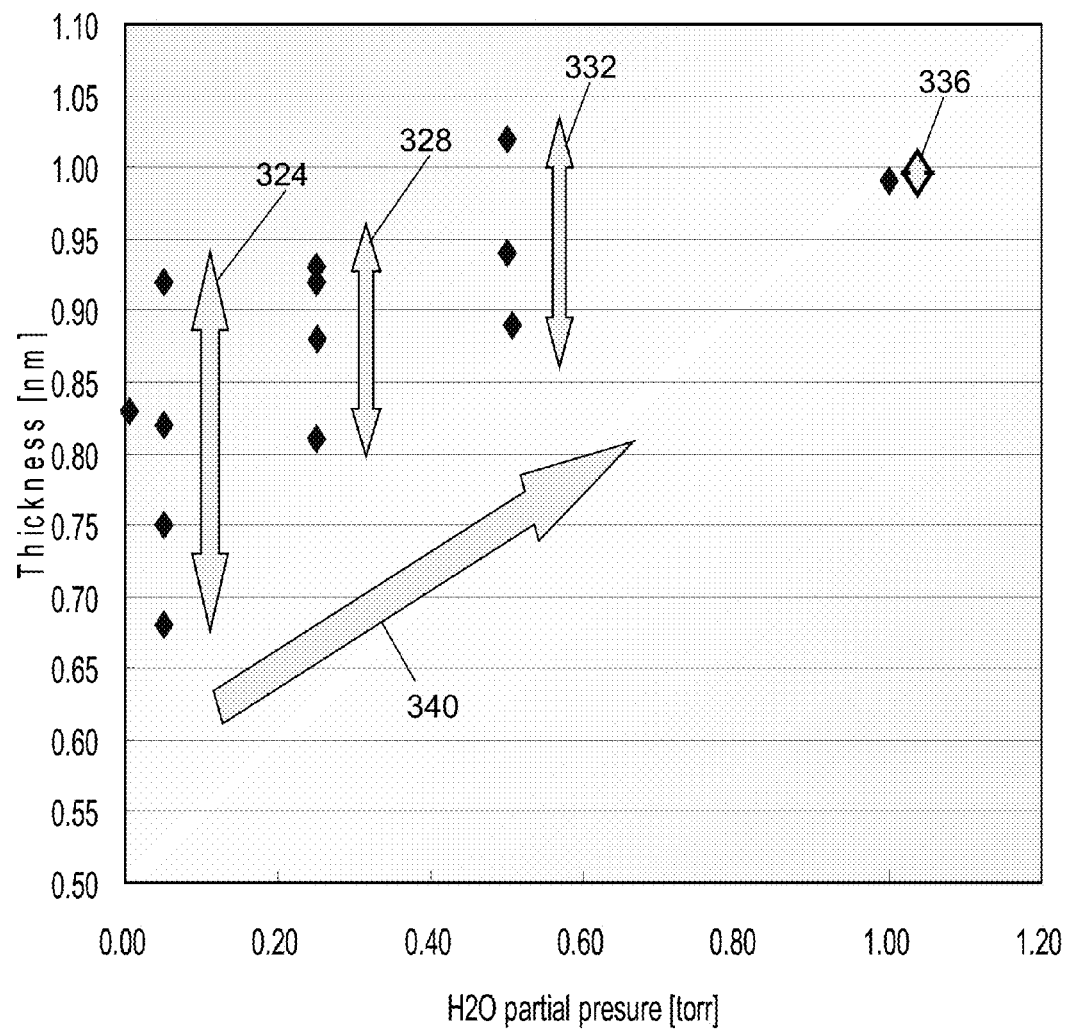
FIG. 4B is an exemplary graph of the thickness of a structure in a patterned layer on the substrate as a function of water vapor partial pressure in the process chamber during a process step in the integration scheme of the present invention.

FIG. 4B is an exemplary graph 320 of the oxide layer thickness of a structure in a patterned layer on the substrate as a function of water vapor partial pressure during a step in the integration scheme of the present invention. The X-axis is the H2O (water vapor) pressure in Torr and Y-axis is the oxide layer thickness during an oxidation operation such as operation 5 of FIG. 1A or operation 29 of FIG. 1B. Based on the clusters of measurements of oxidation thickness as function of the measurements of corresponding water vapor pressure, there is a direct, almost linear correlation of the oxide layer thickness and the water vapor partial pressure. With reference to arrow 324, the oxide layer thickness ranges from 0.67 to 0.93 nm when the water vapor partial pressure is 0.03 Torr; with arrow 328, the oxide layer thickness ranges from 0.80 to 0.94 nm when the water vapor partial pressure is 0.23 Torr; with arrow 332, the oxide layer thickness ranges from 0.88 to 1.03 nm when the water vapor partial pressure is 0.48 Torr; and with arrow 336, the oxide layer thickness ranges from 0.99 to 1.01 nm when the water vapor partial pressure is 0.98 Torr. The trends shown in FIG. 4B illustrate oxidation thickness control by partial pressure of oxidant, which can be used in conjunction with the temperature/process time trends of FIG. 4A to define a precise oxidation thickness process. Correlations of these types of data are entered into the controller 555 of the processing systems discussed in FIGS. 5 to 11. The entered data and historical data are used in operation 13 of FIG. 1A, or operation 37 of FIG. 1B, to control the selected one or more integration operating variables in order to achieve one or more target critical dimensions of the structure.

FIG. 4C1 is an exemplary graph 340 of oxide thickness as a function of oxidation time and substrate temperature during the oxidation operation in the integration scheme of the present invention. The X-axis is the oxidation time in hours whereas the Y-axis is the oxide thickness in micrometers, um. The curves represent the values of the data at different temperatures: curve 344 for 1200° C., curve 348 for 1100° C., curve 352 for 1000° C., and curve 356 for 920° C. The curves are basically linear indicating a direct correlation of oxide thickness to oxidation time in the range of 0.02 to 10.0 hours. The trends in the FIG. 4C1 graph show how many oxidation thickness targets can be achieved, depending on oxidation temperature and time. For a given target oxidation thickness, the appropriate oxidation temperature, oxidant partial pressure and time can be defined to optimize the accuracy of the oxidation thickness, as shown in the flattening trend lines of curves 304 and 312 of FIG. 4A.

FIG. 4C2 is another exemplary graph 360 of oxide thickness as a function of oxidation time and substrate temperature during a step in the integration scheme of the present invention. The X-axis is the oxidation time in hours whereas the Y-axis is the oxide thickness in micrometers, um. The curves represent the values of the data at different temperatures: curve 364 for 1200° C., curve 368 for 1100° C., curve 372 for 1000° C., curve 376 for 900° C., curve 380 for 800° C., curve 384 for 700° C. and. The curves are basically linear indicating a direct correlation of oxide thickness to oxidation time in the range of 0.2 to 100.0 hours. The relationship of the data from FIGS. 4C1 and 4C2 for different kinds of semiconductor application are integrated into data stored in a controller that is used to control the various operations of the integration scheme of the present invention. Correlations of these types of data are entered into the controller 555 of the processing systems discussed in FIGS. 5 to 11. The entered data and historical data are used in operation 13 of FIG. 1A, or operation 37 of FIG. 1B, to control the selected one or more integration operating variables in order to achieve one or more target critical dimensions of the structure.

Figure 4D:
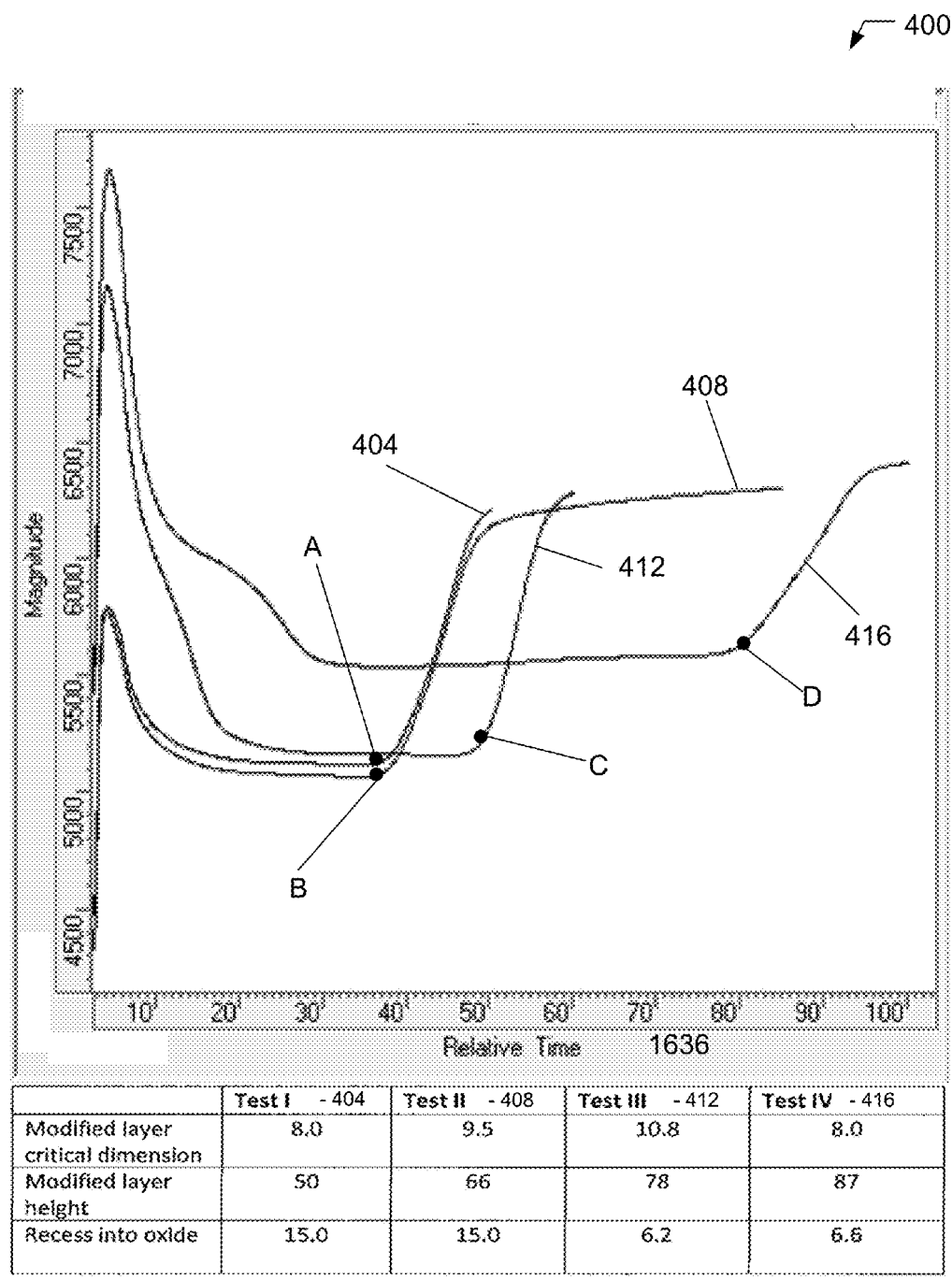
FIG. 4D includes an exemplary graph of the magnitude of the optical emission spectroscopy (OES) signals versus the relative time of processing during a process step in the integration scheme of the present invention.

FIG. 4D includes an exemplary graph 400 of the magnitude of the optical emission spectroscopy (OES) signals versus the relative time of processing during a mandrel pull operation in the integration scheme of the present invention. The X-axis shows the relative time from the beginning of the integration scheme whereas the Y-axis shows the magnitude of OES measurements for the mandrel pull operation such as operation 9 of FIG. 1A or operation 33 of FIG. 1B. Curve 404 corresponds to the relative time and OES measurements for Test I, 404, where the modified layer critical dimension is 8.0 nm, modified layer height is 50 nm, and the recess into oxide is 15.0 nm and where point A is the transition from low to high OES measurement. Curve 408 corresponds to the relative time and OES measurements for Test II, 408, where the modified layer critical dimension is 9.5 nm, modified layer height is 66 nm, and the recess into oxide is 15.0 nm and where point B is the transition from low to high OES measurement. Curve 412 corresponds to the relative time and OES measurements for Test III, 412, where the modified layer critical dimension is 10.8 nm, modified layer height is 78 nm, and the recess into oxide is 6.2 nm and where point C is the transition from low to high OES measurement. Curve 416 corresponds to the relative time and OES measurements for Test IV, 416, where the modified layer critical dimension is 8.0 nm, modified layer height is 87 nm, and the recess into oxide is 6.6 nm and where point D is the transition from low to high OES measurement.

In another embodiment, the completion of etch step may be indicated by a shift from low to high magnitude of OES measurement. Test I and II used a 10-second breakthrough operation with Test I using an 85-second mandrel pull operation and Test II using a 50-mandrel pull operation. Test III and IV used a 5-second breakthrough operation with Test III using a 60-second mandrel pull while Test IV used a reduced peak-to-peak voltage mandrel pull operation. Test I and II provided good modified layer height retention and recess into the oxide. Test IV showed improved modified layer height but with no improvement in the line width and line edge roughness. As mentioned above, correlations of these types of data are entered into the controller 555 of the processing systems discussed in FIGS. 5 to 11. The entered data and historical data are used in operation 13 of FIG. 1A, or operation 37 of FIG. 1B, to control the selected one or more integration operating variables in order to achieve one or more target critical dimensions of the structure such as modified layer critical dimension, layer height, recess into the oxide, line width roughness, and/or line edge roughness.

One or more of the methods for performing material processing to achieve sub-10 nm patterning described above may be performed utilizing a processing system such as those described in FIG. 5 through 11 as described below. However, the methods discussed are not to be limited in scope by this exemplary presentation. Other method for performing material processing to achieve higher densities can also be used.

Figure 5:
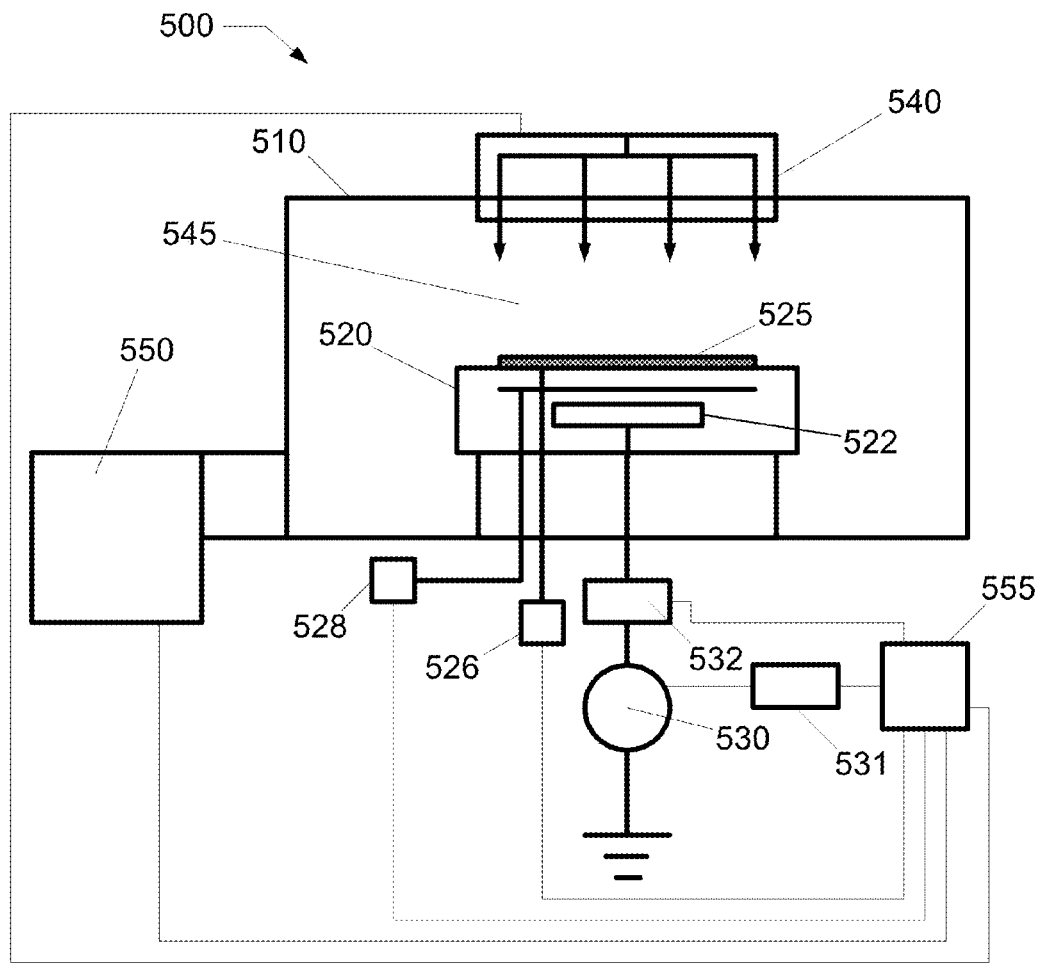
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a pre-determined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, □-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
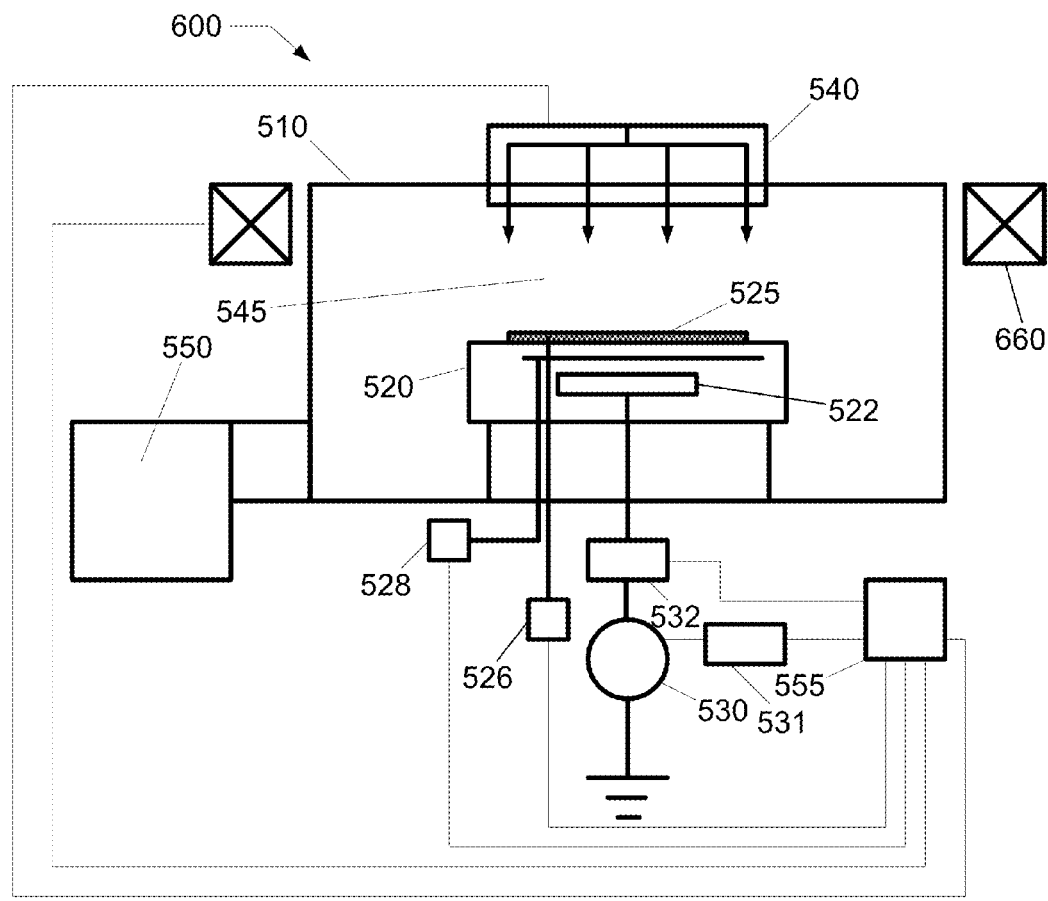
FIG. 6 shows a schematic representation of a plasma processing system according to another embodiment.
Figure 7:
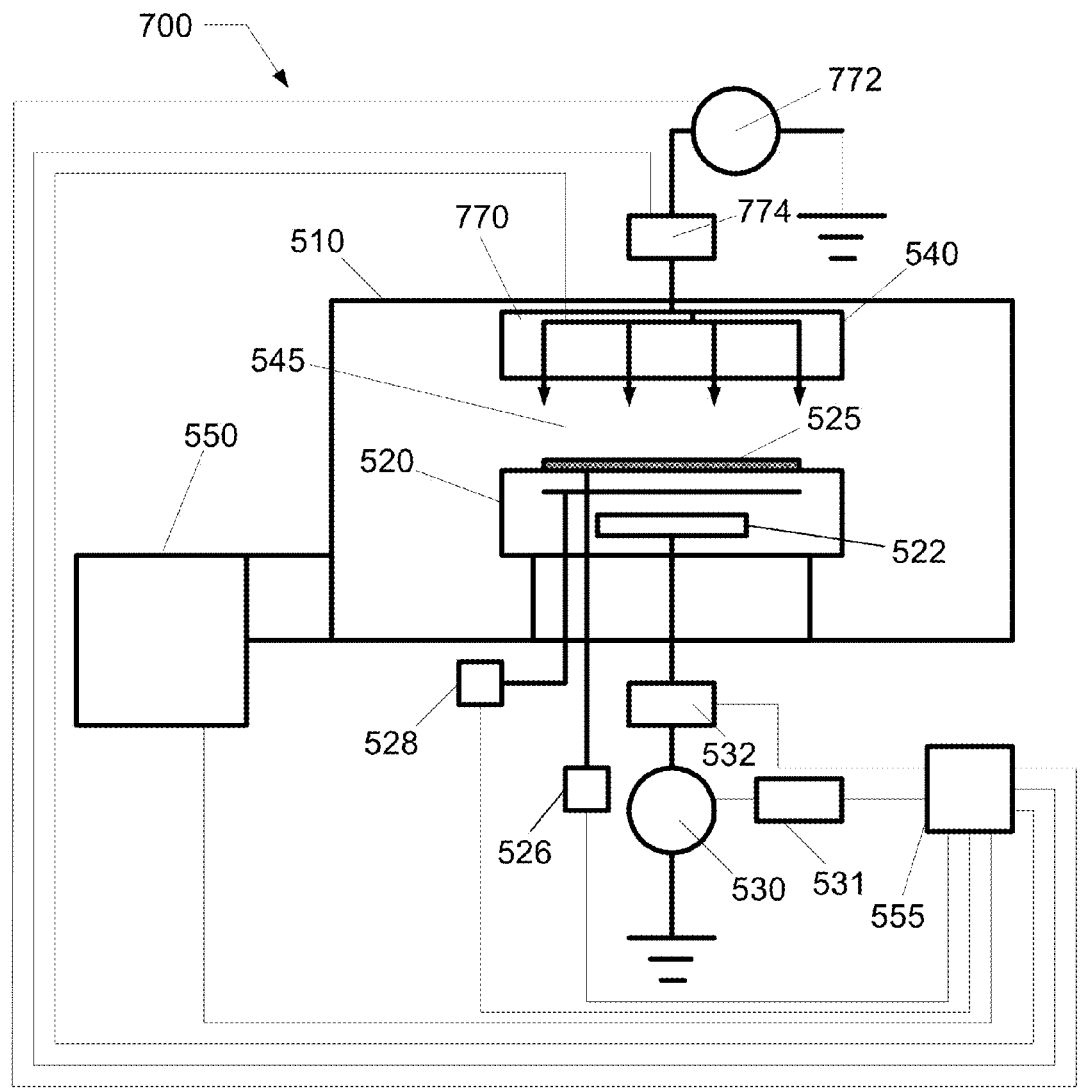
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
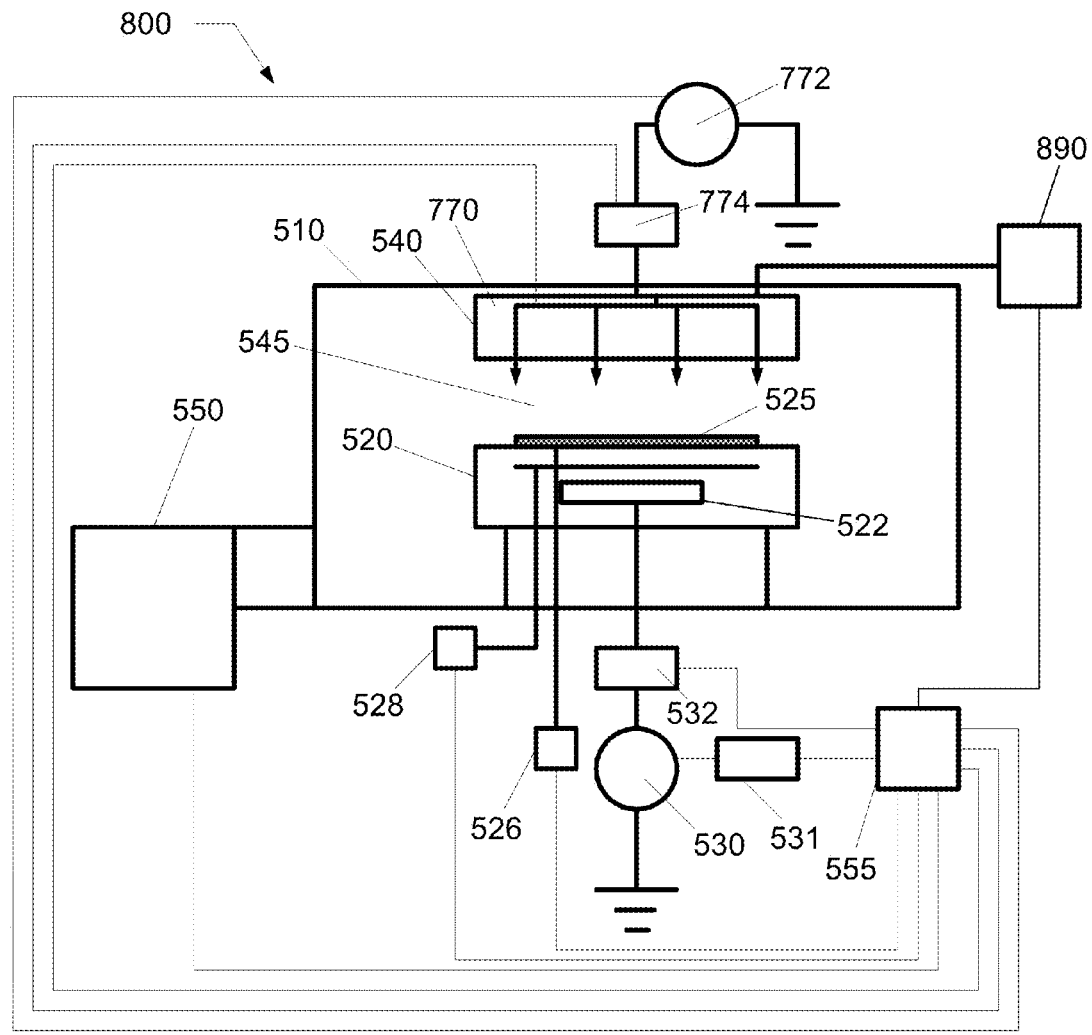
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
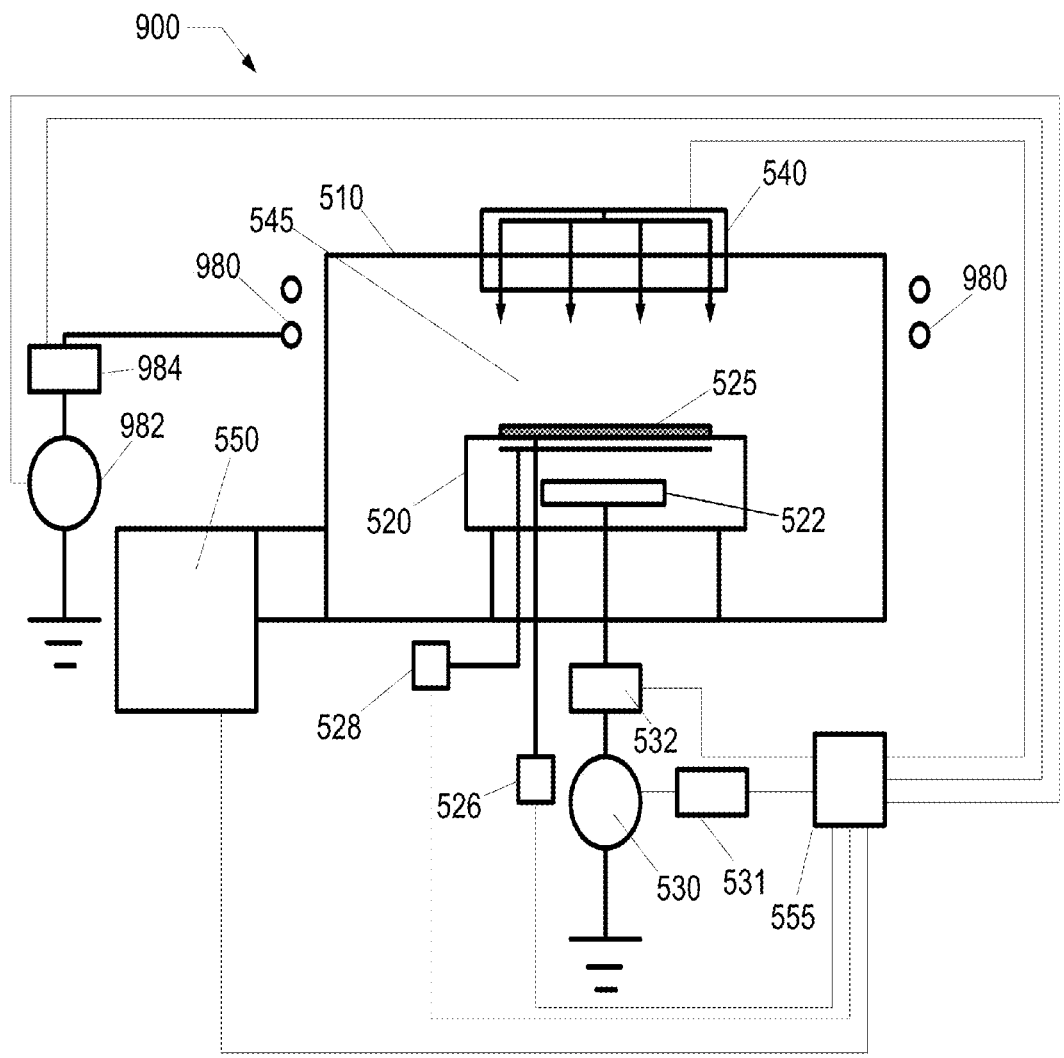
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
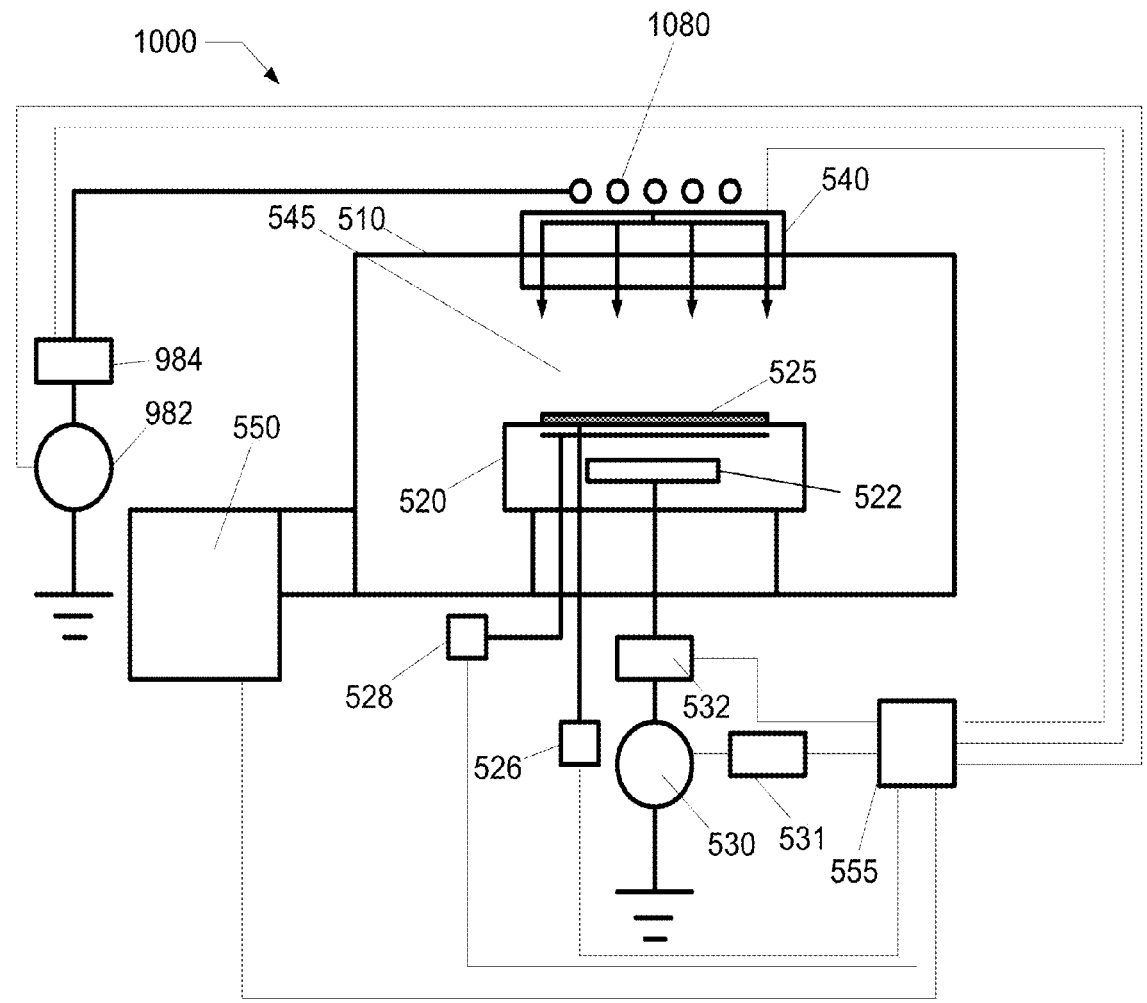
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
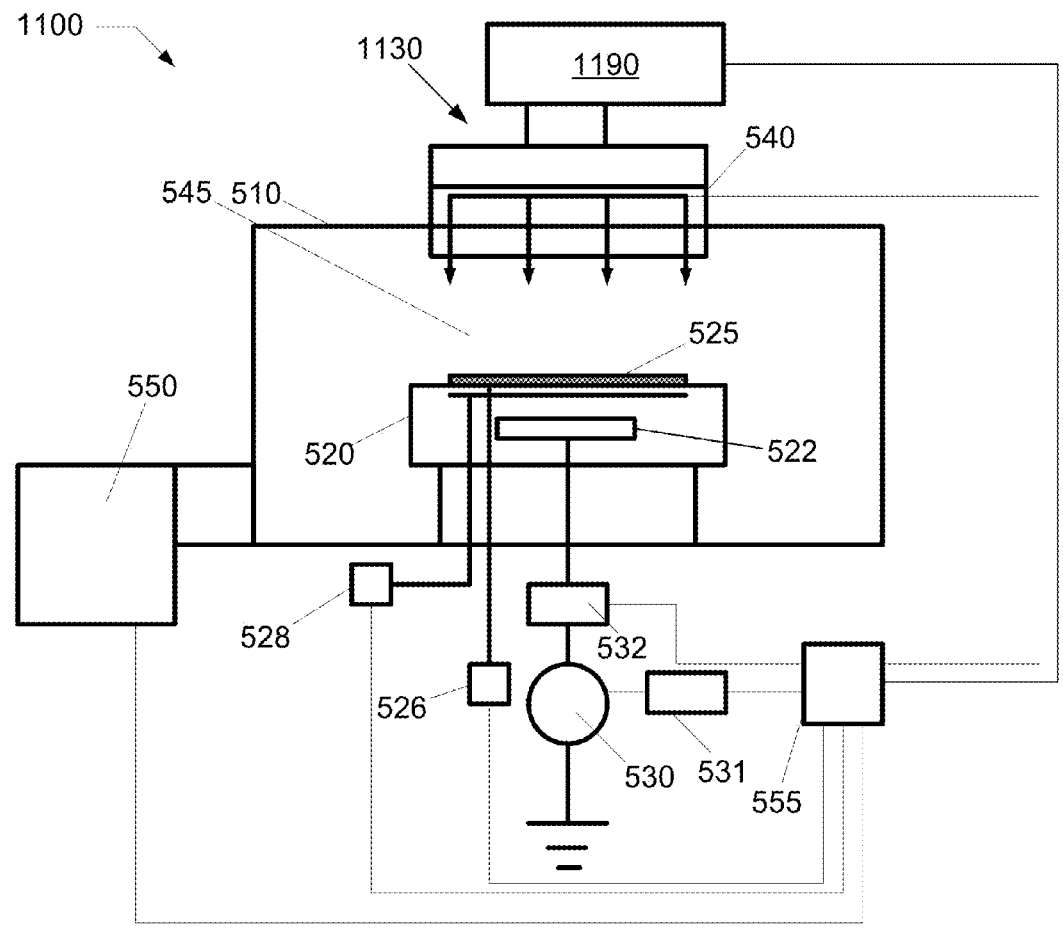
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Figure 12:
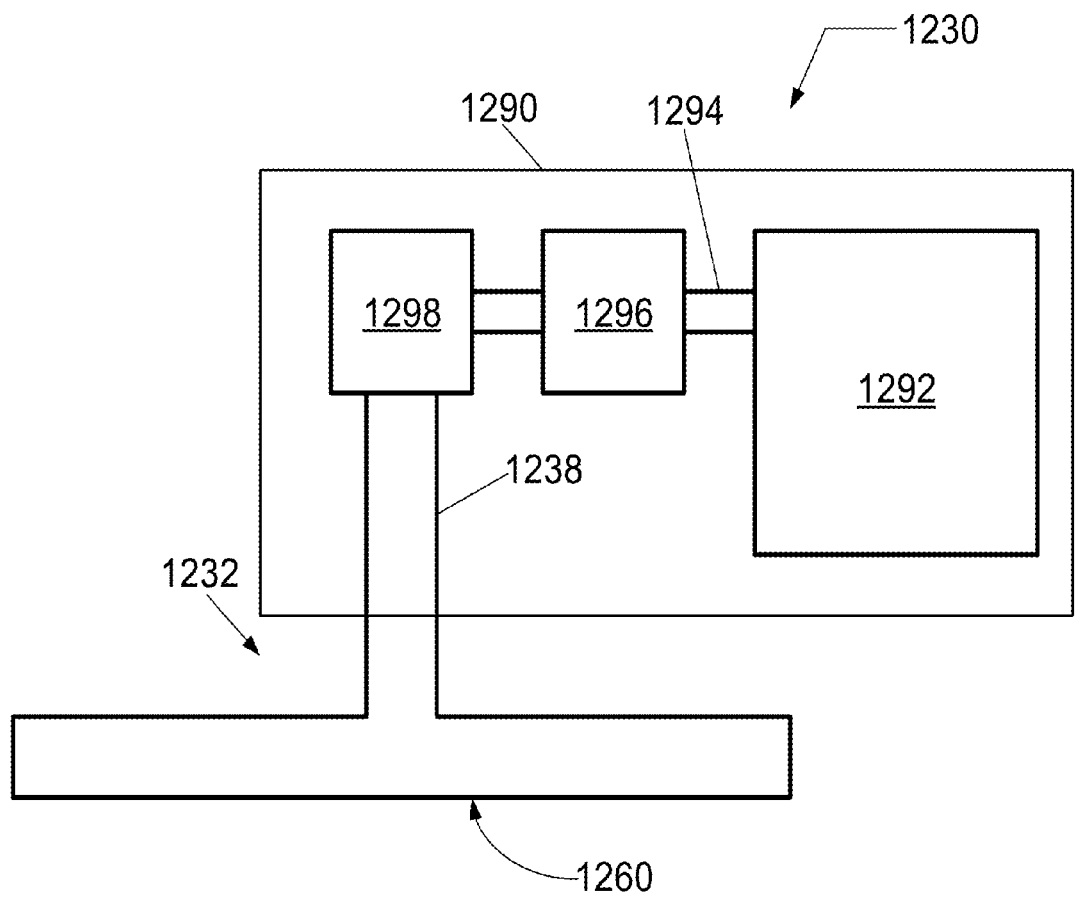
FIG. 12 depicts a cross-sectional view of a plasma source in accordance with one embodiment.

Referring now to FIG. 12, a schematic representation of a SWP source 1230 is provided according to an embodiment. The SWP source 1230 comprises an electromagnetic (EM) wave launcher 1232 configured to couple EM energy in a desired EM wave mode to a plasma by generating a surface wave on a plasma surface 1260 of the EM wave launcher 1232 adjacent plasma. Furthermore, the SWP source 1230 comprises a power coupling system 1290 coupled to the EM wave launcher 1232, and configured to provide the EM energy to the EM wave launcher 1232 for forming the plasma.

The EM wave launcher 1232 includes a microwave launcher configured to radiate microwave power into plasma processing region 545 (see FIG. 11). The EM wave launcher 1232 is coupled to the power coupling system 1290 via coaxial feed 1238 through which microwave energy is transferred. The power coupling system 1290 includes a microwave source 1292, such as a 2.45 GHz microwave power source. Microwave energy generated by the microwave source 1292 is guided through a waveguide 1294 to an isolator 1296 for absorbing microwave energy reflected back to the microwave source 1292. Thereafter, the microwave energy is converted to a coaxial TEM (transverse electromagnetic) mode via a coaxial converter 1298.

A tuner may be employed for impedance matching, and improved power transfer. The microwave energy is coupled to the EM wave launcher 1232 via the coaxial feed 1238, wherein another mode change occurs from the TEM mode in the coaxial feed 1238 to a TM (transverse magnetic) mode. Additional details regarding the design of the coaxial feed 1238 and the EM wave launcher 1232 can be found in U.S. Pat. No. 5,024,716, entitled "Plasma processing apparatus for etching, ashing, and film-formation"; the content of which is herein incorporated by reference in its entirety.

Figure 13A:
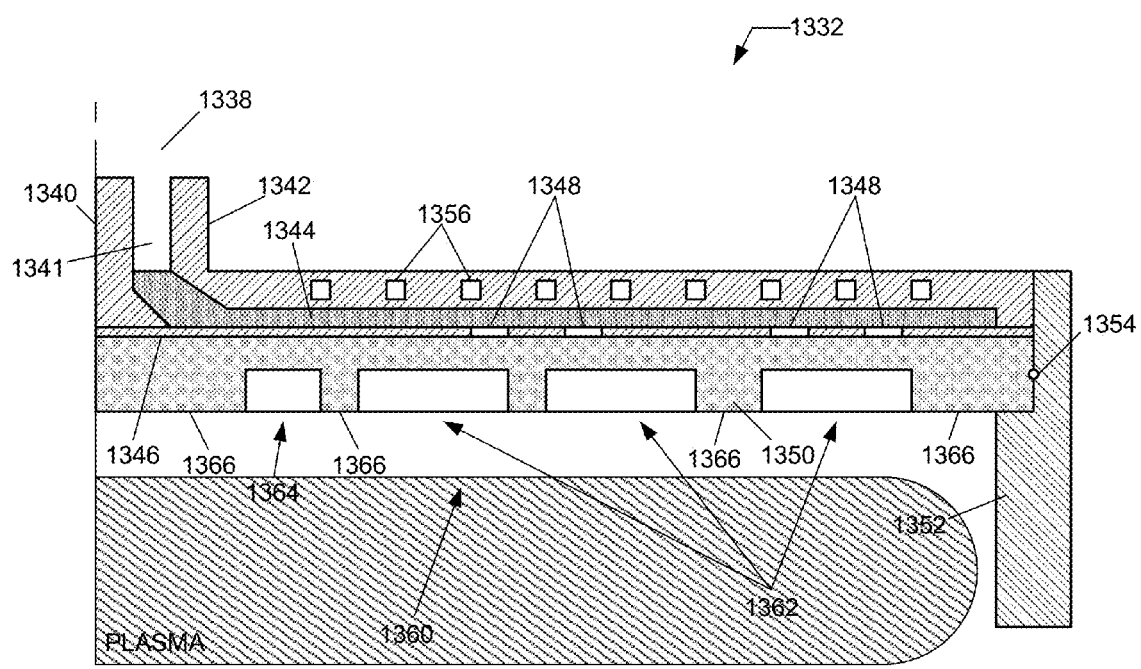
Figure 13B:
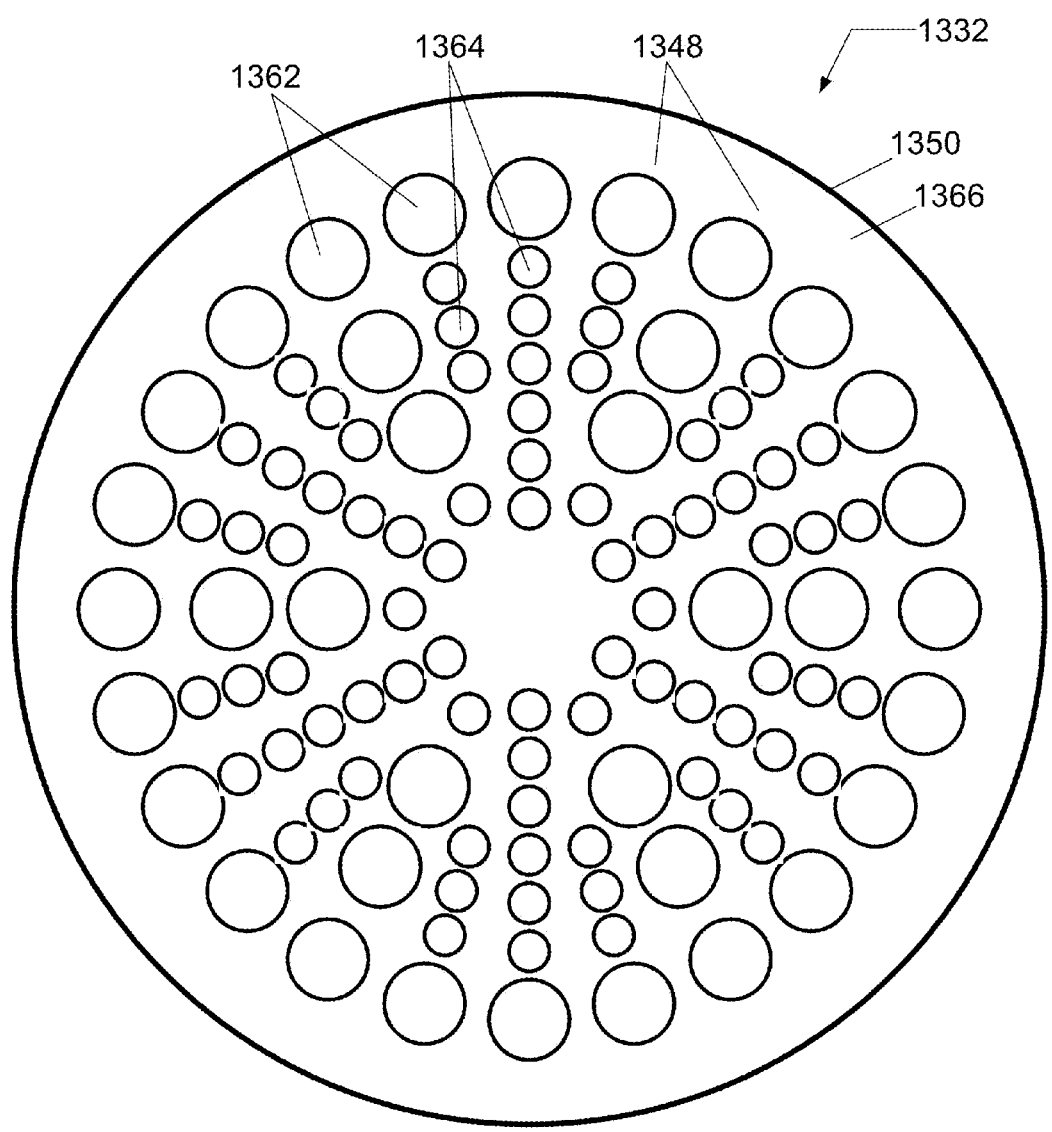

Referring now to FIGS. 13A and 13B, a schematic cross-sectional view and a bottom view, respectively, of an EM wave launcher 1332 are provided according to one embodiment. The EM wave launcher 1332 comprises a coaxial feed 1338 having an inner conductor 1340, an outer conductor 1342, and insulator 1341, such as an air gap, and a slot antenna 1346 having a plurality of slots 1348 coupled between the inner conductor 1340 and the outer conductor 1342 as shown in FIG. 13A. The plurality of slots 1348 permits the coupling of EM energy from a first region above the slot antenna 1346 to a second region below the slot antenna 1346, wherein plasma is formed adjacent a plasma surface 1360 on the EM wave launcher 1332. The EM wave launcher 1332 may further comprise a slow wave plate 1344, and a resonator plate 1350.

The number, geometry, size, and distribution of the slots 1348 are all factors that can contribute to the spatial uniformity of the plasma formed in the plasma processing region 545 (see FIG. 11). Thus, the design of the slot antenna 1346 may be used to control the spatial uniformity of the plasma in the plasma processing region 545 (see FIG. 11).

As shown in FIG. 13A, the EM wave launcher 1332 may comprise a fluid channel 1356 that is configured to flow a temperature control fluid for temperature control of the EM wave launcher 1332. Although not shown, the EM wave launcher 1332 may further be configured to introduce a process gas through the plasma surface 1360 to the plasma. Although not shown, a gas distribution system, such as the gas distribution system (540) of FIG. 11, may be connected to the EM wave launcher 1332 and/or the chamber wall 1352 for introducing a process gas into the process chamber.

Referring still to FIG. 13A, the EM wave launcher 1332 may be coupled to an upper chamber portion of a plasma processing system, wherein a vacuum seal can be formed between an upper chamber wall 1352 and the EM wave launcher 1332 using a sealing device 1354. The sealing device 1354 can include an elastomer O-ring; however, other known sealing mechanisms may be used.

In general, the inner conductor 1340 and the outer conductor 1342 of the coaxial feed 1338 comprise a conductive material, such as a metal, while the slow wave plate 1344 and the resonator plate 1350 comprise a dielectric material. In the latter, the slow wave plate 1344 and the resonator plate 1350 preferably comprise the same material; however, different materials may be used. The material selected for fabrication of the slow wave plate 1344 is chosen to reduce the wavelength of the propagating electromagnetic (EM) wave relative to the corresponding free-space wavelength, and the dimensions of the slow wave plate 1344 and the resonator plate 1350 are chosen to ensure the formation of a standing wave effective for radiating EM energy into the plasma processing region 545 (see FIG. 11).

The slow wave plate 1344 and the resonator plate 1350 can be fabricated from a dielectric material, including silicon-containing materials such as quartz (silicon dioxide), or a high dielectric constant (high-k) materials. For example, the high-k material may possess a dielectric constant greater than a value of 4. In particular, when the plasma processing system is utilized for etch process applications, quartz is often chosen for compatibility with the etch process.

For example, the high-k material can include intrinsic crystal silicon, alumina ceramic, aluminum nitride, and sapphire. However, other high-k materials may be used. Moreover, a particular high-k material may be selected in accordance with the parameters of a particular process. For example, when the resonator plate 1350 is fabricated from intrinsic crystal silicon, the plasma frequency exceeds 2.45 GHz at a temperature of 45 degrees C. Therefore, intrinsic crystal silicon is appropriate for low temperature processes (i.e., less than 45 degrees C.). For higher temperature processes, the resonator plate 1350 can be fabricated from alumina (Al2O3), or sapphire.

Plasma uniformity and plasma stability may remain as challenges for the practical implementation of a SWP source as described above. In the latter, the standing wave at the resonator plate-plasma interface, i.e., at the plasma surface 1360, may be prone to mode jumps as plasma parameters shift.

As shown in FIGS. 13A and 13B, the EM wave launcher 1332 may be fabricated with a first recess configuration 1362 formed in the plasma surface 1360 and optionally a second recess configuration 1364 formed in the plasma surface 1360 according to one embodiment.

The first recess configuration 1362 may comprise a first plurality of recesses. Each recess in the first recess configuration 1362 may comprise a unique indentation or dimple formed within the plasma surface 1360. For example, a recess in the first recess configuration 1362 may comprise a cylindrical geometry, a conical geometry, a frusto-conical geometry, a spherical geometry, an aspherical geometry, a rectangular geometry, a pyramidal geometry, or any arbitrary shape. The first recess distribution 1362 may comprise recesses characterized by a first size (e.g., latitudinal dimension (or width), and/or longitudinal dimension (or depth)).

The second recess configuration 1364 may comprise a plurality of recesses. Each recess in the second recess configuration 1364 may comprise a unique indentation or dimple formed within the plasma surface 1360. For example, a recess in the second recess configuration 1364 may comprise a cylindrical geometry, a conical geometry, a frusto-conical geometry, a spherical geometry, an aspherical geometry, a rectangular geometry, a pyramidal geometry, or any arbitrary shape. The second recess distribution 1364 may comprise recesses characterized by a second size (e.g., latitudinal dimension (or width), and/or longitudinal dimension (or depth)). The first size of the recesses in the first recess configuration 1362 may or may not be the same as the second size of the recesses in the second recess configuration 1364. For instance, the second size may be smaller than the first size.

As shown in FIGS. 13A and 13B, the resonator plate 1350 comprises a dielectric plate having a plate diameter and a plate thickness. Therein, the plasma surface 1360 on resonator plate 1350 comprises a planar surface 1366 within which the first recess configuration 1362 and the second recess configuration 1364 are formed. Alternatively, the resonator plate 1350 comprises a non-planar geometry or an arbitrary geometry. Therein, the plasma surface 1360 may comprise a non-planar surface within which the first recess configuration and the second recess configuration are formed (not shown). For example, the non-planar surface may be concave, or convex, or a combination thereof.

The propagation of EM energy in the resonator plate 1350 may be characterized by an effective wavelength ($\lambda$) for a given frequency of EM energy and dielectric constant for the resonator plate 1350. The plate thickness may be an integer number of quarter wavelengths ($n\lambda/4$, where n is an integer greater than zero) or an integer number of half wavelengths ($m\lambda/2$, where m is an integer greater than zero). For instance, the plate thickness may be about half the effective wavelength ($\lambda/2$) or greater than half the effective wavelength ($>\lambda/2$). Alternatively, the plate thickness may be a non-integral fraction of the effective wavelength (i.e., not an integral number of half or quarter wavelengths). Alternatively yet, the plate thickness may range from about 25 mm (millimeters) to about 45 mm.

As an example, the first recess configuration 1362 may comprise a first plurality of cylindrical recesses, wherein each of the first plurality of cylindrical recesses is characterized by a first depth and a first diameter. As shown in FIG. 13B, the first recess configuration 1362 is located near an outer region of the plasma surface 1360.

The first diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a first difference between the plate thickness and the first depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the first diameter may be about half the effective wavelength ($\lambda/2$), and the first difference between the plate thickness and the first depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the first diameter may range from about 25 mm to about 35 mm, and the first difference between the plate thickness and the first depth may range from about 10 mm to about 35 mm. Alternatively yet, the first diameter may range from about 30 mm to about 35 mm, and the first difference may range from about 10 mm to about 20 mm. Alternatively yet, the first diameter and/or first depth may be a fraction of the plate thickness.

In the first recess configuration 1362, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

As another example, the second recess configuration 1364 may comprise a second plurality of cylindrical recesses, each of the second plurality of cylindrical recesses being characterized by a second depth and a second diameter. As shown in FIG. 13B, the second recess configuration 1364 is located near an inner region of the plasma surface 1360.

The second diameter may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. Additionally, a second difference between the plate thickness and the second depth may be an integer number of quarter wavelengths ($n\lambda/4$, where n is an integer greater than zero), or an integer number of half wavelengths ($m\lambda/2$, where m is an integer greater than zero), or a non-integral fraction of the effective wavelength. For instance, the second diameter may be about half the effective wavelength ($\lambda/2$), and the second difference between the plate thickness and the second depth may be about half the effective wavelength ($\lambda/2$) or about quarter the effective wavelength ($\lambda/4$). Additionally, for instance, the plate thickness may be about half the effective wavelength ($\lambda/2$) or greater than half the effective wavelength ($>\lambda/2$).

Alternatively, the second diameter may range from about 25 mm to about 35 mm, and the second difference between the plate thickness and the second depth may range from about 10 mm to about 35 mm. Alternatively yet, the second diameter may range from about 30 mm to about 35 mm, and the second difference may range from about 10 mm to about 20 mm. Alternatively yet, the second diameter and/or second depth may be a fraction of the plate thickness.

In the second recess configuration 1364, chamfers, rounds and/or fillets (i.e., surface/corner radius or bevel) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma surface 1360. For example, the surface radius may range from about 1 mm to about 3 mm.

Referring again to FIG. 13B, a bottom view of the EM wave launcher 1332 depicted in FIG. 13A is provided. The plurality of slots 1348 in slot antenna 1346 are illustrated as if one can see through resonator plate 1350 to the slot antenna 1346. As shown in FIG. 13B, the plurality of slots 1348 may be arranged in pairs, wherein each of the pair of slots comprises a first slot oriented orthogonal to a second slot. However, the orientation of slots in the plurality of slots 1348 may be arbitrary. For example, the orientation of slots in the plurality of slots 1348 may be according to a predetermined pattern for plasma uniformity and/or plasma stability.

The first recess configuration 1362 is substantially aligned with a first arrangement of slots in the plurality of slots 1348. Therein, at least one recess of the first recess configuration 1362 may be aligned, partially aligned, or not aligned with one or more of the plurality of slots 1348. The second recess configuration 1364 is either partly aligned with a second arrangement of slots in the plurality of slots 1348 or not aligned with the second arrangement of slots in the plurality of slots 1348. As shown in FIG. 13B, the second recess configuration 1364 is not aligned with the second arrangement of slots in the plurality of slots 1348.

As a consequence, the arrangement of the first and second recess configurations 1362, 1364 and their alignment with one or more of the plurality of slots 1348 may be optimized to control and/or improve plasma uniformity and/or stability. Additional details regarding the design of the plasma surface 1360 and the EM wave launcher 1332 can be found in pending U.S. Patent Application Publication Serial No. 2011/0057562, entitled "Stable surface wave plasma source", and filed on Sep. 8, 2009; the content of which is herein incorporated by reference in its entirety.

Although only certain embodiments of this invention have been described in detail above, those skilled in the art will readily appreciate that many modifications are possible in the embodiments without materially departing from the novel teachings and advantages of this invention. For example, the integration schemes can be extended beyond the embodiments described to include quad-patterning, octo-patterning combined or not combined with EUV processes to achieve patterned features as small as 1 to 2 nm wide up to 6 to 7 nm wide. Accordingly, all such modifications are intended to be included within the scope of this invention.

The invention claimed is:

1. A method for increasing pattern density of a structure on a substrate using an integration scheme, said integration scheme having one or more integration operating variables, the method comprising:
   providing a substrate having a patterned layer of a first composition in a process chamber, said patterned layer comprising at least one structure with a sidewall and a top surface;
   exposing said sidewall and top surface to a chemical environment to chemically modify said sidewall and top surface of said structure to a predetermined depth by introducing a constituent of said chemical environment to an exposed surface region of said structure and creating a chemically modified sidewall layer and cap layer of a second composition; and
   removing said cap layer to expose an interior, non-modified portion of said structure;
   selectively removing said interior, non-modified portion of said structure to leave behind said chemically modified sidewall layer;
   selecting said chemical environment to include said constituent that modifies an etch resistance of said chemically modified sidewall layer to a class of etching agents used in said selectively removing said interior, non-modified portion, said second composition being more resistant to said class of etching agents than said first composition; and
   performing a pattern transfer etch of said chemically modified sidewall layer onto an underlying layer of said substrate;
   wherein said one or more integration operating variables comprises a hydrogen, oxygen, and nitrogen ratio, a process chamber temperature, a thickness of said chemically modified sidewall layer, a water vapor partial pressure, and an exposure time to said chemical environment.

2. The method of claim 1, further comprising:
   controlling selected one or more integration operating variables in order to achieve one or more target critical dimensions of said structure, said one or more target critical dimensions (CD) comprising width, height, and/or line edge roughness of said structure.

3. The method of claim 2, wherein providing said substrate comprises providing a substrate fabricated using lithography, self-aligned double patterning (SADP), or directed self-assembly (DSA).

4. The method of claim 3, wherein the exposing said sidewall and top surface, removing said cap layer, selectively removing said interior, non-modified portion of said structure, and performing said pattern transfer etch of said chemically modified sidewall layer onto the underlying layer of said substrate are all done in situ in said process chamber.

5. The method of claim 4, wherein said process chamber uses a high density plasma generated using a power source including inductive coupled plasma (ICP), radial line slot antenna (RLSA), or electron cyclotron resonance (ECR) devices.

6. The method of claim 4:
   wherein removing said cap layer utilizes a plasma chemistry using carbon tetrafluoride, oxygen, and argon or silicon hexafluoride, oxygen, and helium; and/or
   wherein said substrate includes a stop layer, the stop layer comprising silicon oxynitride, silicon nitride, or titanium nitride.

7. The method of claim 4;
   wherein said chemical environment comprises an oxygen-containing environment to provide oxygen as said constituent, a nitrogen-containing environment to provide nitrogen as said constituent, or a dopant-containing environment to provide dopant as said constituent;
   wherein if said chemical environment comprises said oxygen-containing environment, said oxygen-containing environment comprises oxygen, carbon monoxide, carbon dioxide, and/or nitrogen dioxide; or
   wherein if said chemical environment comprises said nitrogen-containing environment, said nitrogen-containing environment comprises nitrogen, ammonia and/or hydrazine; or
   wherein if said chemical environment comprises said dopant-containing environment, said dopant-containing environment comprises borane, diborane, phosphine, and/or arsine.

8. The method of claim 7;
wherein a ratio of hydrogen, oxygen, and nitrogen is in a range from 0/50/9,000 to 300/400/11,000 and/or said temperature of said process chamber is in a range from 700 to 1200° C.

9. The method of claim 7:
wherein said cap layer is an oxide layer of thickness in a range from 0.01 to 1.05 nm, said water vapor partial pressure is in a range from 0.10 to 1.00 Torr, and/or said exposure time is in a range from 0.02 to 50 hr.

10. The method of claim 7:
wherein said thickness of said chemically modified sidewall layer is one of 9.0 nm or less, 7.0 nm or less; or 5 nm or less.

11. A method for increasing pattern density of a structure on a substrate using an integration scheme, said integration scheme having one or more integration operating variables, the method comprising:
providing a substrate having a patterned layer in a process chamber, said patterned layer comprising at least one mandrel, said mandrel comprising organic planarizing spin-on material, silicon nitride, or photoresist fabricated using a self-aligned double patterning scheme;
depositing a conformal spacer layer on said patterned layer;
performing a spacer reactive ion etching (RIE) sequence using silicon etching chemistry;
performing a mandrel-pull strip sequence using a stripping technique based on material used for said mandrel, said mandrel-pull strip sequence generating a spacer with a sidewall and a top surface;
exposing said sidewall and top surface to a chemical environment to chemically modify said sidewall and top surface to a predetermined depth, creating a chemically modified sidewall layer and cap layer;
removing said cap layer and bottom portion of the substrate proximate to said spacer;
performing a spacer-pull etch sequence configured to remove a non-modified portion of said spacer using at least one etching process to leave behind said chemically modified sidewall layer; and
performing a pattern transfer etch sequence of said chemically modified sidewall layer onto an underlying layer of said substrate;
wherein said one or more integration operating variables comprises a hydrogen, oxygen, and nitrogen ratio, a process chamber temperature, a thickness of said sidewall chemically modified layer, a water vapor partial pressure, a thickness of said cap layer, and an exposure time to said chemical environment.

12. The method of claim 11, further comprising:
controlling selected one or more integration operating variables in order to achieve one or more target critical dimensions of said structure, said one or more target critical dimensions comprising width, height, or line edge roughness of said structure.

13. The method of claim 12, wherein depositing said conformal spacer layer, exposing said sidewall and top surface, performing said mandrel-pull strip sequence, removing said cap layer, performing said spacer-pull etch sequence, and performing said pattern transfer etch sequence of said layer onto the underlying layer of said substrate are all done in situ in said process chamber.

14. The method of claim 13:
wherein performing said mandrel-pull strip sequence using said stripping technique based on material used for said mandrel utilizes an in situ plasma strip if said mandrel is made of organic material or a wet strip using hot phosphoric acid if said mandrel is made of silicon nitride; and/or
wherein a plasma chamber uses a high density plasma generated using a power source including inductive coupled plasma (ICP), radial line slot antenna (RLSA), or electron cyclotron resonance (ECR) devices.

15. The method of claim 14, wherein performing said spacer RIE sequence utilizes a first set of RIE chemicals including hydrogen bromide, oxygen, and argon or a second set of RIE chemicals including chlorine, oxygen, and argon or a combination of the first set and second set of RIE chemicals with additional gases to get a desired spacer profile.

16. The method of claim 14:
wherein said mandrel comprises organic planarizing spin-on material, silicon nitride or photoresist that is fabricated using a self-aligned quad or octo-patterning scheme; and/or
wherein said self-aligned quad or octo-patterning scheme is combined or is not combined with extreme ultra violet (EUV) lithography.

17. The method of claim 14
wherein said chemical environment comprises an oxygen containing environment or a nitrogen containing environment;
wherein said oxygen-containing environment comprises oxygen, carbon monoxide, carbon dioxide, and/or nitrogen dioxide; and
wherein said nitrogen-containing environment comprises nitrogen, ammonia and/or hydrazine.

18. The method of claim 17:
wherein removing said cap layer utilizes a plasma chemistry using carbon tetrafluoride, oxygen, and argon or silicon hexafluoride, oxygen, and helium; and/or
wherein said substrate includes a stop layer, said stop layer comprising silicon oxynitride, silicon nitride, or titanium nitride.

19. The method of claim 17
wherein a ratio of hydrogen, oxygen, and nitrogen is in a range from 0/50/9,000 to 300/400/11,000 and/or
wherein said process chamber temperature is in a range from 700 to 1200° C.

20. The method of claim 17:
wherein said cap layer is an oxide layer of thickness in a range from 0.01 to 1.05 nm, said water vapor partial pressure is in a range from 0.10 to 1.00 Torr, said exposure time is in a range from 0.02 to 50 hr; and/or
wherein said thickness of said chemically modified sidewall layer is one of 9.0 nm or less, 7.0 nm or less; or 5 nm or less.

* * * * *